United States Patent
Kanda et al.

[11] Patent Number: 6,115,322
[45] Date of Patent: Sep. 5, 2000

[54] SEMICONDUCTOR DEVICE ACCEPTING DATA WHICH INCLUDES SERIAL DATA SIGNALS, IN SYNCHRONIZATION WITH A DATA STROBE SIGNAL

[75] Inventors: Tatsuya Kanda; Hiroyoshi Tomita, both of Kawasaki, Japan

[73] Assignee: Fujitsu Limited, Kanagawa, Japan

[21] Appl. No.: 09/266,583

[22] Filed: Mar. 11, 1999

[30] Foreign Application Priority Data

Nov. 19, 1998  [JP]  Japan ................................. 10-329531

[51] Int. Cl.$^7$ ........................................................ G11C 8/00
[52] U.S. Cl. ................ 365/233; 365/230.08; 365/189.05
[58] Field of Search ................................... 365/233, 236, 365/191, 189.05, 230.08, 230.06

[56] References Cited

U.S. PATENT DOCUMENTS

| | | | |
|---|---|---|---|
| 5,926,434 | 7/1999 | Mori | 365/233 |
| 5,946,265 | 8/1999 | Cowles | 265/233 |
| 5,963,504 | 10/1999 | Manning | 365/233.5 |

*Primary Examiner*—David Nelms
*Assistant Examiner*—Thong Le

*Attorney, Agent, or Firm*—Arent Fox Kintner Plotkin & Kahn PLLC

[57] ABSTRACT

A semiconductor device for accepting a data from outside in synchronization with data strobe signal. The semiconductor device includes control circuit for generating an accept-control signal which is activated in response to a write command inputted in synchronization with a clock signal and is inactivated in response to the data strobe signal in synchronization with the final data signal, and data input circuit for accepting the data signals while the accept-control signal is activated. The timing of the accept-control signal varies in accordance with the variation of the timing of the data strobe signal because the control circuit controls so as to inactivate the accept-control signal in response to the data strobe signal. Hence, inactivating of the accept-control signal is always performed within a predetermined time period after the final data signal is accepted in synchronization with the data strobe signal. As a result, the inactivating of the accept-control signal is accurately controlled in synchronization with the data strobe signal. Therefore, only necessary write-data are reliably accepted even if the timing of the data strobe signal varies.

18 Claims, 30 Drawing Sheets

SEMICONDUCTOR DEVICE ACCEPTING DATA WHICH INCLUDES SERIAL DATA SIGNALS, IN SYNCHRONIZATION WITH A DATA STROBE SIGNAL

BACKGROUND OF THE INVENTION

1. Field of the Invention

This invention relates to a semiconductor device that operates in synchronization with clock signal inputted from the outside, and particularly, to a semiconductor device which accepts write-data in synchronization with a data strobe signal.

2. Description of the Related Art

In general, microcomputers, Synchronous Dynamic Random Access Memory (hereafter referred to as SDRAM) or the like are known as semiconductor devices of integrated circuits or the like which operate in synchronization with a clock signal.

SDRAM are widely used as main memory of work stations or personal computers, and those with maximum operating frequency exceeding 100 MHz have been developed. With regard to workstations or the like, too, clock frequency of clock signal used is increasing year by year.

FIG. 25 shows an example of an information processing system including a plurality of SDRAM 102a, 102b, and 102c, and a CPU 103 for controlling these SDRAM 102a, 102b, and 102c that are installed on a printed wiring board 101. In the example, the CPU 103 outputs address signals AD, a control signal CTL, and a clock signal CLK to each of the SDRAM 102a, 102b, and 102c. The CPU 103 and each of the SDRAM 102a, 102b, and 102c input and output data signals DQ which is an input/output signal.

FIG. 26 shows the operation timing when the CPU 103 reads out data stored in the SDRAM 102a, 102b, and 102c. Here, although FIG. 26 also puts in rows, the operation timing of SDRAM 102a, 102b, and 102c, the CPU 103 actually accesses each SDRAM 102a, 102b, and 102c at different timings, respectively.

Now, propagation delay time of the signal transmitted between the CPU 103 and each of the SDRAM 102a, 102b, and 102c differs according to the wiring pattern length on the printed wiring board 101 of each signal. In this example, the propagation delay time is shortest between the SDRAM 102a and the CPU 103, and longest between the SDRAM 102c and the CPU 103. Therefore the clock signal CLK, the control signal CTL, and the address signals AD that are outputted from the CPU 103 are transmitted in the order of SDRAM 102a, 102b, and 102c. The SDRAM 102a, 102b, and 102c accept the control signal CTL and the address signals AD in synchronization with the clock signal CLK inputted into respective SDRAM at different timings, read out read-data from memory cells selected by the address signals AD when the control signal CTL instructs reading out, and output, as a data signals DQ, the read-data which is read out. In this process, the read-data from the SDRAM 102a is outputted earliest and the read-data from the SDRAM 102c is outputted latest. That is, skew (deviation of output timing) according to propagation delay time due to the wiring pattern length occurs when outputting the read-data.

The CPU 103 accepts, at a predetermined timing, the data signals DQ outputted from the SDRAM 102a, 102b, and 102c. The timing of accepting the data signals DQ by the CPU 103 is set in accordance with the SDRAM 102c, which outputs the data signals DQ latest, in order to accept the data signals DQ with reliability.

On the other hand, when writing data into the SDRAM 102a, 102b, and 102c, deviation between the timings of receiving the data signals DQ and the address signals AD occurs at the SDRAM 102a, 102b, and 102c, even if the address signals AD and the data signals DQ are outputted from the CPU 103 in synchronization with each other. This is because, although the wiring pattern lengths of the address signals AD and the data signals DQ connecting the CPU 103 and each of the SDRAM 102a, 102b, and 102c are roughly the same, their wiring capacities differ.

Here, while an example is shown in FIG. 25 wherein the clock signal CLK is generated inside the CPU 103, the clock signal CLK, when generated in a device other than the CPU 103, causes a large skew as shown in FIG. 26 in the write operation as in the case with the read operation.

The skew generated by the propagation delay time depending on the above-mentioned wiring pattern length is determined by wiring resistance and wiring capacitance but will not be affected by change of clock frequency. Therefore the skew becomes relatively larger as the clock frequency is set higher. This results in a problem that, in the case of read operation, timing design of an information processing system becomes difficult when the skew of the data signals DQ accepted by the CPU 103 becomes equal to or higher than a predetermined ratio relative to the cycle of the clock signal CLK.

In order to solve the problem, a new type of SDRAM has been proposed, which includes a synchronization signal DS (data strobe signal) specific for write/read of the data signals DQ.

The data strobe signal DS is outputted from the CPU in synchronization with the data signals DQ when the data is transmitted from the CPU to the SDRAM, whereas it is outputted from the SDRAM in synchronization with the data signals DQ when the data is transmitted from the SDRAM to the CPU. Besides, since the wiring pattern of the data strobe signal DS formed on the printed wiring board has nearly the same wiring length/wiring capacitance as those with the wiring pattern of corresponding data signals DQ, the device at the receiving side of the data signals DQ can receive the data signals DQ at a correct timing in synchronization with the data strobe signal DS.

FIGS. 27 to 30 show an exemplary composition proposed by the present inventors in order to implement an SDRAM having an input/output functionality of the data strobe signal DS. Here the SDRAM shown in FIGS. 27 to 30 is not yet known.

In FIG. 27, the SDRAM 105 comprises an input/output interface unit 106, a memory control interface unit 107, and a memory cell array 108.

The clock signal CLK, a chip select signal /CS, a row address strobe signal /RAS, a column address strobe signal /CAS, a write enable signal /WE, the address signals AD, the data signals DQ, and a data strobe signal DS are supplied to the input/output interface unit 106. The address signals AD and the data signals DQ or the like, which are denoted by thick arrows in the figure, are signals consisting of a plurality of bits.

The "/" expression such as /CS, /RAS or the like, implies negative logic, i.e., the signal is activated when it is at LOW level. The data signals DQ and the data strobe signal DS are input/output signals. In this example, SSTL-2 (Stub Series Terminated Transceiver Logic-2) interface is applied as an interface specification, wherein an information processing system including the SDRAM 105 is required to have the signal line for transmitting the data signals DQ and the data strobe signal DS terminated at a predetermined voltage.

The input/output interface unit 106 has a clock buffer 109, a command decoder 110, an address buffer 111, an input/output data buffer 112, and a DS input/output control circuit 113.

The clock buffer 109 receives an external clock signal CLK and outputs an internal clock signal CLKIN, denoted by the dashed line in the figure, to the outside.

The command decoder 110 receives the chip select signal /CS, the row address strobe signal /RAS, the column address strobe signal /CAS, and the write enable signal /WE, and outputs a command signal CMD according to the signal levels of these control signals /CS, /RAS, /CAS, and /WE to the memory control interface unit 107 and the DS input/output control circuit 113. The command decoder 110 determines that a "write command" is inputted and sets the write activate signal WRTZ that is one of command signals CMD to HIGH level when the control signals are, for example, such as /CS=LOW level, /RAS=HIGH level, /CAS=LOW level, and /WE=LOW level.

The address buffer 111 receives the address signals AD, converts the received address signals AD into internal address signals ADIN, and outputs the ADIN to the memory control interface unit 107.

The input/output data buffer 112 performs input/output operation of the data signals DQ with the outside, while performing input/output operation of I/O signals DIN with the memory cell array 108.

The DS input/output control circuit 113 performs input/output operation of the data strobe signal DS with the outside, and receives the write activate signal WRTZ. The DS input/output control circuit 113 controls the input/output timing of the data signals DQ in the input/output data buffer 113.

The memory control interface unit 107 has a control circuit 114 for performing timing control of the entire SDRAM 105, a mode register 115 for setting the operation modes such as the Burst Length which is the number of transfers when successively transferring the data signals DQ or latency, and a burst counter 116 for counting the above-mentioned burst length.

A plurality of memory cells, not shown, are arranged in rows and columns in the memory cell array 108. Control signals RAS, CAS, and WE generated from the control signals /RAS, /CAS, and /WE, and row address signals, column address signals, and the I/O signals DIN are connected between the memory cell array 108 and the memory control interface unit 107.

Here, as SDRAM 105 of this kind, Single Data Rate type (hereinafter SDR type) which performs write/read of the data signals DQ in synchronization with only the leading edge of the data strobe signal DS, and Double Data Rate type (hereinafter DDR type) which performs write/read operations of the data signals DQ in synchronization with both the leading edge and the trailing edge of the data strobe signal DS have been proposed.

FIG. 28 shows an exemplary information processing system including an SDRAM 105 having a data strobe signal DS and a memory control circuit 118 for controlling the SDRAM 105 on a printed wiring board 117. The memory control circuit 118 comprises, for example, a CPU 119 and a clock control circuit 120.

Each of the control signals /CS, /RAS, /CAS, and /WE of the memory control circuit 118 and the SDRAM 105, and the address signals AD, the data signals DQ, the clock signal CLK, and the data strobe signal DS are connected to each other by the trace wiring formed on the printed wiring board 117. Additionally, the signal line which is an input/output terminal for transmitting the data signals DQ and the data strobe signal DS is connected, via a terminating resistor 121, to a predetermined voltage VTT defined by the SSTL-2 interface. Therefore, when both the memory control circuit 118 and the SDRAM 105 are driving neither the data signals DQ nor the data strobe signal DS, the voltage level of the data signals DQ or the data strobe signal DS has become the terminal voltage VTT. Here, the voltage VTT is set to half the value of the supply voltage for the input/output signal line.

FIG. 29 shows an example of operation timing when the memory control circuit 118 writes data into the DDR type SDRAM 105, in the information processing system shown in FIG. 28. In this example, the "burst length" is set to "4". At the time of write operation, the clock signal CLK, the data strobe signal DS, and the data signals DQ are outputted by the memory control circuit 118. The write activate signal WRTZ and the I/O signals DIN are signals used in the internal circuit of the SDRAM 105 shown in FIG. 27. The timings of the address signals AD and the control signals /CS, /RAS, /CAS, and /WE are omitted.

First, the memory control circuit 118 inputs write command into the SDRAM 105 by setting the control signals /CS, /RAS, /CAS, and /WE to a predetermined value in synchronization with the leading edge of the clock signal CLK.

The SDRAM 105, upon input of the write command, sets the write activate signal WRTZ to HIGH level, and activates the input/output data buffer 112 via the DS input/output control circuit 113 shown in FIG. 27. The activating turns the input/output buffer 112 into a state capable of accepting the data signals DQ.

Next, the memory control circuit 118 sets the data strobe signal DS to LOW level within a predetermined time period (about a half clock delay in the example of FIG. 29) from the rising of the clock signal CLK when the write command is received. Then, rise and fall of the data strobe signal DS is repeated the number of times equal the "burst length" with the same periodicity as that of the clock signal CLK, and simultaneously, write-data D0, D1, D2, D3 are inputted to the data terminal DQ.

Here, although the timing of the first rise of the data strobe signal DS (time 1 of FIG. 29) is defined to be one clock period later than the timing of the rise of the clock signal CLK in synchronization with the receipt of the write command, a phase deviation of ±25% relative to the rise of the clock signal CLK at time 1 is allowed.

The SDRAM 105 accepts write-data D0, D1, D2, D3 sequentially in synchronization with the leading edge and the trailing edge of the data strobe signal DS. The SDRAM 105 outputs the accepted write-data D0, D1, D2, D3 to the memory cell array 108 via the internal I/O signals DIN.

The SDRAM 105 counts up the burst counter 116 shown in FIG. 27 each time the clock signal CLK rises after receipt of the write command. In the case with the DDR type, counting by the burst counter 116 is performed the number of times which is half as much as the "burst length".

In the example shown in FIG. 29, having allowed a predetermined time period after the burst counter 116 counted "2", which is half the "burst length (4)", the command decoder 110 sets the write activate signal WRTZ to LOW level, and inactivates the input/output data buffer 112.

The above-mentioned predetermined time period from the end of counting to the setting of the write activate signal WRTZ to LOW level is generated by a delay circuit such as a time constant circuit, being composed of capacitors and resistors. Also, the predetermined time period is set so that the final write-data D3 can be accepted with reliability, even if the ambient temperature and the supply voltage varied within specification, and the phase of the data strobe signal DS delayed relative to the clock signal by +25%.

That is, when the burst length is constant, the timing at which the write activate signal WRTZ turns from HIGH level to LOW level (inactivated) does not change regardless of the phase deviation (within ±25%) of the data strobe signal DS relative to the clock signal CLK, and remains the same as the inactivate timing of the write activate signal WRTZ when the above-mentioned deviation is +25% (the phase of the data strobe signal DS delayed relative to the clock signal CLK by 25%).

The memory control circuit 118 maintains the data strobe signal DS at LOW level for a period as long as about half clock after the trailing edge, being in synchronization with the final write-data D3, of the data strobe signal DS. Then, the memory control circuit 118 stops outputting the data strobe signal DS. Therefore, the voltage level of the data strobe signal DS becomes the terminal voltage VTT supplied via the terminating resistor 121. And the write operation is completed.

Now, as described above, the phase of the data strobe signal DS outputted from the memory control circuit 118 is allowed to deviate within a predetermined range (±25% in the above-mentioned example) relative to the clock signal CLK. Also the inactivate timing of the write activate signal WRTZ is set to be in accordance with the case in which the phase of the data strobe signal DS delays by 25% relative to the clock signal (+25%).

Therefore, as shown in FIG. 30, in a timing design wherein the phase of the data strobe signal DS outputted from the memory control circuit 118 is designed to deviate by −25% (earlier by 25%) relative to the clock signal CLK, there is a possibility that a period HZ may arise during which the write activate signal WRTZ remains at HIGH level after the receipt operation of the write-data has completed and the data strobe signal DS has become the terminal voltage VTT.

There has been a problem that, during the period HZ, noise may be generated in the data strobe signal DS due to influence of noise from the power source or the like, and, if the noise is transmitted into the SDRAM 105, erroneous data may be accepted after the final write-data D3, as shown in FIG. 30. This may result in writing erroneous data into the memory cell array 108 and destroying the valid data.

SUMMARY OF THE INVENTION

It is an object of the present invention, having been made in order to solve the problems described above, to provide a semiconductor device which accepts, with reliability, only necessary write-data even if the timing of the data strobe signal varies.

It is another object of the present invention to provide a semiconductor device that prevents accepting erroneous data due to noise generated in the data strobe signal.

The semiconductor device according to the present invention, being a semiconductor device for accepting serial data signals, which includes serial data signals from outside, in synchronization with the data strobe signal, comprises a data input circuit accepting data which is transferred to an internal circuit, the data input circuit has an inactive state in response to 0 timing of the data strobe signal corresponding to a final bit of the serial data signals.

As a result, the transmission of data to the internal circuits is accurately controlled in synchronization with the data strobe signal, and the data is accepted with reliability. Besides, acceptance of erroneous data due to noise generated in the data strobe signal is prevented.

Furthermore, the semiconductor device according to the present invention comprises a control circuit and data input circuit. The control circuit activates an accept-control signal in response to a write command inputted in synchronization with a clock signal, and inactivates an accept-control signal in response to a data strobe signal corresponding to a final data signal of the data signals. Thus, the control circuit according to the present invention, unlike those of prior arts, performs control in which the accept-control signal is inactivated by the data strobe signal.

Because the control for inactivating the accept-control signal is performed in response to the data strobe signal, the timing of the accept-control signal varies in accordance with the variation of the data strobe signal. Therefore, inactivation of the accept-control signal is always performed within a predetermined time period after the final data signal is accepted in synchronization with the data strobe signal. As a result, the inactivation of the accept-control signal is accurately controlled in synchronization with the data strobe signal, thereby preventing accepting erroneous data due to noise generated in the data strobe signal.

Besides, in the semiconductor device according to the present invention, a counter counts the number of the clock signal after receipt of the write command. The control circuit inactivates the accept-control signal following the input of the data strobe signal after a completion of the counting at the counter.

Thus, by associating the "number" of the clock signal with the "accepted number" of the data signals, the data strobe signal inputted after the completion of the counting at the counter becomes the data strobe signal being in synchronization with the final data signals. That is, the data strobe signal being in synchronization with the final data signals can be easily and reliably detected by the counter.

In the semiconductor device according to the present invention, the data input circuit comprises an accept clock generation circuit, and a data accept circuit. The accept clock generation circuit generates a data accept clock signal in synchronization with the data strobe signal during the activated period of the accept-control signal. The accept clock generation circuit does not generate the data accept clock signal during the inactivated period of the accept-control signal. The data accept circuit inputs the data accept clock signal, and accepts the data in synchronization with the data accept clock signal. Therefore, generation or non-generation of the data accept clock signal is directly controlled by the accept-control signal, and acceptance of a number of data signals becomes possible.

In the semiconductor device according to the present invention, the control circuit inactivates the accept-control signal, following the output of the data accept clock signal after the completion of the counting at the counter.

Therefore, since inactivation of the accept-control signal is performed by the data accept clock signal that directly controls the accepting of the data signals, the data signals accepting can be performed with a simple control circuit.

In another semiconductor device according to the present invention, the data input circuit comprises an accept clock generation circuit, and a data accept circuit. The accept clock generation circuit generates a first data accept clock signal and a second data accept clock signal, each being in synchronization with the leading edge and the trailing edge of the data strobe signal, during the activated period of the accept-control signal. The accept clock generation circuit neither generates the first data accept clock signal nor the second data accept clock signal during the inactivated period of the accept-control signal. The data accept circuit inputs the first and the second data accept clock signals, and accepts the data signals in synchronization with each of the first and the second data accept clock signals. Therefore, generation or non-generation of the first and the second data accept clock signals is directly controlled by the accept-control signal, and the number of data signals are accepted.

Particularly, in a DDR type semiconductor device that accepts the data signals in synchronization with both the leading edge and the trailing edge of the data strobe signal, the data strobe signal in synchronization with the final data signal can be easily and reliably detected.

In another semiconductor device according to the present invention, the control circuit inactivates the accept-control signal, following the output of the first or the second data accept clock signals after the completion of the counting at the counter.

Therefore, since inactivation of the accept-control signal is performed by the first or the second data accept clock signal that directly control the accepting of the data signals, the data signals accepting can be performed with a simple control circuit.

In another semiconductor device according to the present invention, an input buffer accepts the data strobe signal from outside during the activated period of the accept-control signal. The input buffer does not accept the data strobe signal during the inactivated period of the accept-control signal.

Thus, the input buffer being the entrance of the data strobe signal in the semiconductor device is directly controlled by the accept-control signal and a number of data signals are accepted. Therefore, even if noise is generated in the external data strobe signal by power supply noise or the like during the inactivated period of the input buffer, the noise will not be transmitted to internal circuits. As a result, malfunction of internal circuits is prevented, and unnecessary power consumption due to malfunction can also be prevented.

In another semiconductor device according to the present invention, the number of accepted data signals is made to be an integral multiple of the number of the clock signal counted by the counter.

Thus, the data strobe signal in synchronization with the final data signal can be detected in an SDR type semiconductor device which accepts the data in synchronization with either the leading edge or the trailing edge of the data strobe signal, by setting the number of accepted data signals identical with the number of counted clock signal.

Besides, the data strobe signal in synchronization with the final data signal can be detected in a DDR type semiconductor device which accepts the data signals in synchronization with both the leading edge and the trailing edge of the data strobe signal, by setting the number of accepted data signals twice as much as the number of counted clock signal.

In another semiconductor device according to the present invention, data strobe counting circuit counts the number of data strobe signal after receipt of the write command. The control circuit inactivates the accept-control signal after the number of data strobe signal is counted.

Thus, by associating the "number" of the data strobe signal with the "accepted number" of the data signals, the data strobe signal at the time of counting of the number becomes the data strobe signal in synchronization with the final data signal. That is, the data strobe signal in synchronization with the final data signal can be easily and reliably detected by the data strobe counting circuit.

In another semiconductor device according to the present invention, the control circuit inactivates the accept-control signal, following the output of the data accept clock signal after the completion of counting at the data strobe counting circuit.

Therefore, the data signal accepting can be performed with a simple control circuit.

In another semiconductor device according to the present invention, the data strobe counting circuit counts the number of data accept clock signal which performs accepting of the data signals. Since the data accept clock signal is a signal generated from the data strobe signal, counting by the data strobe counting circuit, and activating/inactivating control of the accept-control signal after counting of the number can be performed in synchronization with the data strobe signal.

In another semiconductor device according to the present invention, the control circuit inactivates the accept-control signal, following the output of the first or the second data accept clock signal after the completion of counting at the data strobe counting circuit.

Therefore, the data signals accepting can be performed with a simple control circuit.

In another semiconductor device according to the present invention, the data strobe counting circuit counts one of a first data accept clock signal or a second data accept clock signal which perform accepting of the data signals. Since the first and the second data accept clock signals are signals generated from the data strobe signal, counting by the data strobe counting circuit, and activating/inactivating control of the accept-control signal after counting of the number can be performed in synchronization with the data strobe signal.

In another semiconductor device according to the present invention, the number of the accepted data signals is made to be an integral multiple the number of the data strobe signal counted by the data strobe counting circuit.

Therefore, a similar effect can be obtained as when the above-mentioned number of the accepted data signals is made to be an integral multiple the number of the clock signal counted by the clock counting circuit.

BRIEF DESCRIPTION OF THE DRAWINGS

FIG. 25 is a schematic diagram showing an information processing system using a conventional SDRAM.

FIG. 26 is a timing chart showing a read operation in a conventional information processing system.

DESCRIPTION OF THE PREFERRED EMBODIMENTS

Embodiments of the present invention will be explained in detail in the following with reference to the drawings.

Figure 1:
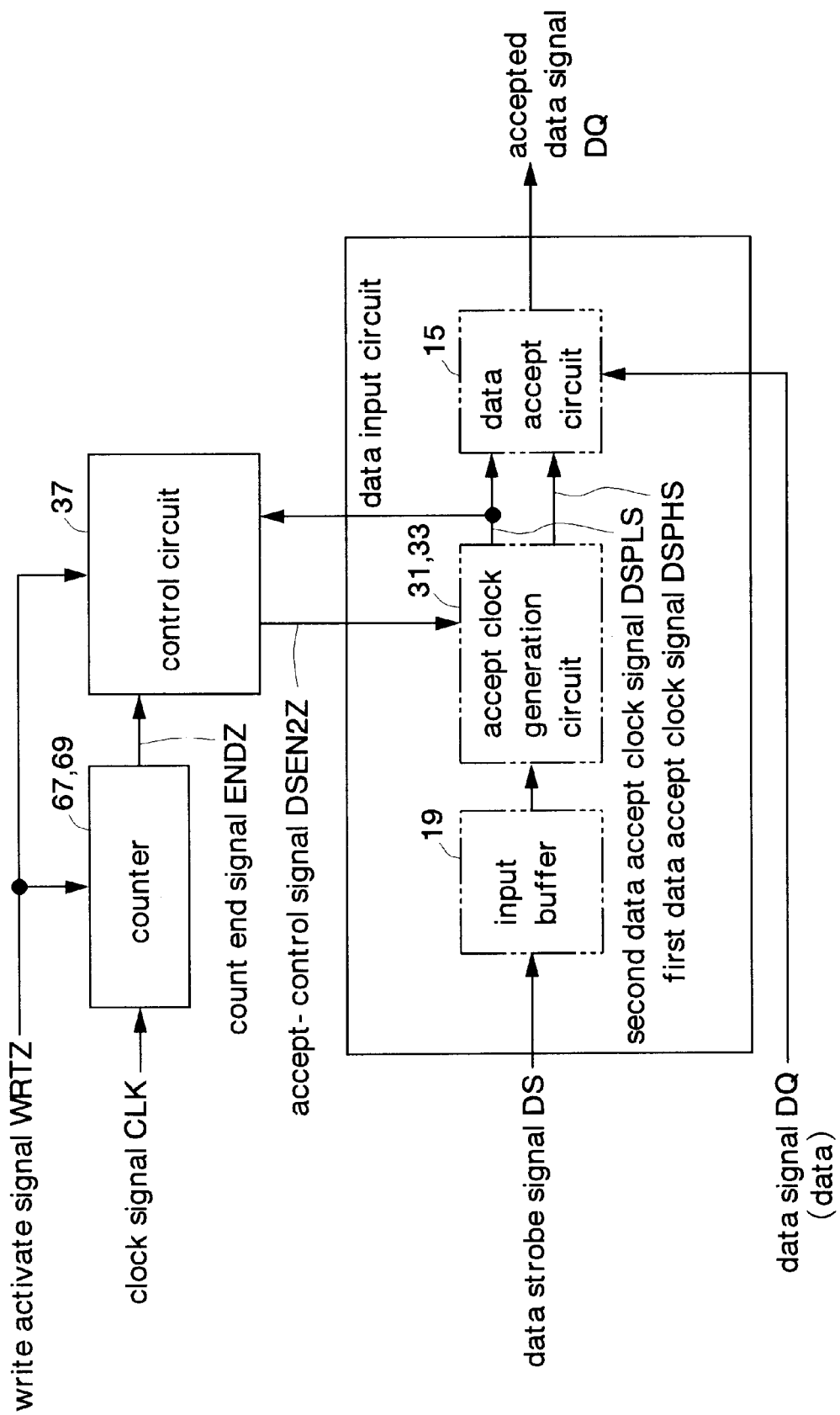
FIG. 1 is a block diagram showing the basic principle of a first embodiment of a semiconductor device according to the present invention.

FIG. 1 is a block diagram showing the basic principle of a first embodiment of a semiconductor device according to the present invention, which comprises a counter, a control circuit, and a data input circuit. The data input circuit includes an input buffer, an accept clock generation circuit, and a data accept circuit.

The counter is circuits corresponding to a counter 67 and a count end detection circuit 69 described below. The control circuit, the input buffer of the data input circuit, and the data accept circuit are circuits corresponding to a latch unit 37, a DS buffer 19, and an input/output buffer 15 described below, respectively. The accept clock generation circuit is circuits corresponding to an H edge pulse generation unit 31 and an L edge pulse generation unit 33.

The counter has a function of counting a predetermined number of clocks of clock signal CLK after a write activate signal WRTZ, to corresponding to a write start signal is activated, and generating and outputting a count end signal ENDZ after the counting is completed.

The control circuit has a function of activating an accept-control signal DSEN2Z when the write activate signal WRTZ corresponding to a write start signal is activated, and inactivating the accept-control signal DSEN2Z after receiving the count end signal ENDZ and also after receiving a second data accept clock signal DSPLS. Here the second data accept clock signal DSPLS is used as a signal substituting a data strobe signal DS.

The accept clock generation circuit has a function of generating and outputting a first and the second data accept clock signals DSPHS and DSPLS from an internal data strobe signal DSZ, only while the accept-control signal DSEN2Z is activated.

The data accept circuit has a function of accepting a data signal DQ, which is the write-data, into the semiconductor device in synchronization with the first and the second data accept clock signals DSPHS and DSPLS.

Figure 2:
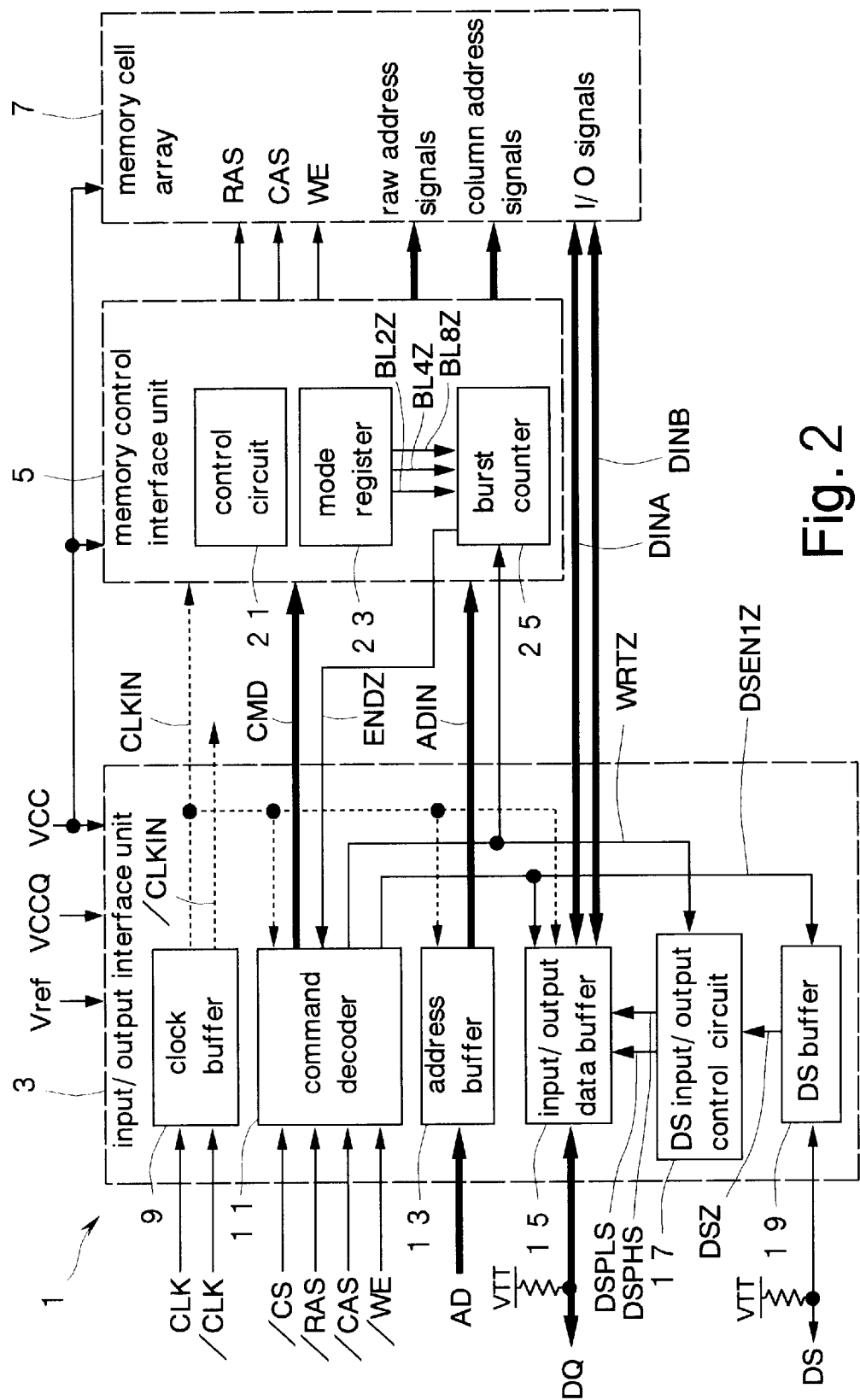
FIG. 2 is a general diagram showing the first embodiment of a semiconductor device according to the present invention.

FIG. 2 shows the first embodiment of the semiconductor device of the present invention.

The semiconductor device according to the embodiment comprises a DDR type SDRAM which performs write/read operations of the data signals DQ in synchronization with both the leading edge and the trailing edge of the data strobe signal inputted from the outside.

In FIG. 2, the semiconductor device 1 comprises an input/output interface unit 3, a memory control interface unit 5, and a memory cell array 7.

Clock signals CLK and /CLK, a chip select signal /CS, a row address strobe signal /RAS, a column address strobe signal /CAS, a write enable signal /WE, and address signals AD, data signals DQ, and a data strobe signal DS are supplied to the input/output interface unit 3.

The data signals DQ and the data strobe signal DS are input/output signals. The address signals AD, the data signals DQ or the like, which are denoted by thick arrows in the figure, are signals consisting of a plurality of bits. Hereinafter, the chip select signal /CS, the row address strobe signal /RAS, the column address strobe signal /CAS, and the write enable signal /WE will be also referred to as control signals /CS, /RAS, /CAS, and /WE, respectively.

The semiconductor device 1 applies the SSTL-2 interface as the interface specification, and an I/O supply voltage VCCQ(2.5V) and a reference voltage Vref(1.25V) are supplied, besides the supply voltage VCC(3.3V), to the input/output interface unit 3. The data strobe signal DS and the data signals DQ are terminated with the same voltage VTT as that of the reference voltage Vref, at the outside of the semiconductor device 1.

The input/output interface unit 3 has a clock buffer 9, a command decoder 11, an address buffer 13, an input/output data buffer 15, a DS input/output control circuit 17, and a DS buffer 19.

The clock buffer 9 receives clock signals CLK and /CLK, and outputs internal clock signals CLKIN and /CLKIN, denoted by the dashed line in the figure.

The command decoder 11 receives the control signals /CS, /RAS, /CAS, and /WE, and outputs a command signal CMD according to the signal levels of each of the signals to the memory control interface unit 5 and the like.

The command decoder 11 has a function of determining that a "write command" is inputted, setting the write activate signal WRTZ which is one of the command signals CMD to HIGH level, and outputting WRTZ to the DS input/output control circuit 17 or the like, when the control signals are such as, for example, /CS=LOW level, /RAS=HIGH level, /CAS=LOW level, and /WE=LOW level. The command decoder 11 outputs an activate signal DSEN1Z which activates the DS buffer 19 to the input/output data buffer 15 and the DS buffer 19. The command decoder 11 also receives a count end signal ENDZ outputted from a burst counter 25 which will be described below.

The address buffer 13 receives the address signals AD, converts the received address signals AD into internal address signals ADIN, and outputs the converted internal address signals ADIN to the memory control interface unit 5.

The input/output data buffer 15 performs input/output operation of the data signals DQ with the outside, while performing input/output operation of I/O signals DINA and DINB with the memory cell array 7. The I/O signals DINA and DINB are signals for performing parallel input/output of the data signals DQ in the semiconductor device 1, the numbers of bits of the I/O signals DINA and DINB being set identical with the number of bits of the data signals DQ, respectively. The input/output data buffer 15 has a function of converting the parallel-processed I/O signals DINA and DINB into a serial data signals DQ. With this function, quick data transfer with the outside can be performed.

The DS input/output control circuit 17 receives the write activate signal WRTZ and outputs a first data accept clock signal DSPHS and a second data accept clock signal DSPLS to the input/output data buffer 15.

The DS buffer 19 is a circuit for controlling the input/output of the data strobe signal DS. The DS buffer 19 converts the received data strobe signal DS into an internal data strobe signal DSZ, and outputs the converted internal data strobe signal DSZ to the input/output control circuit 17.

The memory control interface unit 5 has a control circuit 21 for performing timing control of the entire semiconductor device 1, a mode register 23 for setting the operation modes, and a burst counter 25 for counting the "burst length" which is the number of transfers when successively transferring the data.

The mode register 23 outputs burst length information signals BL2Z, BL4Z, and BL8Z corresponding to the "burst length" which is set from the outside, to the burst counter 25. The mode register 23 has a function of setting only the burst length information signal BL2Z to HIGH level when the "burst length" is set to "2", and similarly setting only the burst length information signal BL4Z or only the burst length information signal BL8Z to HIGH level when the "burst length" is set to "4" or "8", respectively.

A plurality of memory cells, not shown, are arranged in rows and columns in the memory cell array 7. Control signals RAS, CAS, and WE generated from the control signals /RAS, /CAS, and /WE, a row address signal, and a column address signal are connected between the memory cell array 7 and the memory control interface unit 5.

Moreover, I/O signals DINA and DINB are connected between the memory cell array 7 and the input/output interface unit 3.

Here, the semiconductor device 1 according to the present embodiment is manufactured using the CMOS (Complementary MOS) process technology.

Figure 3:
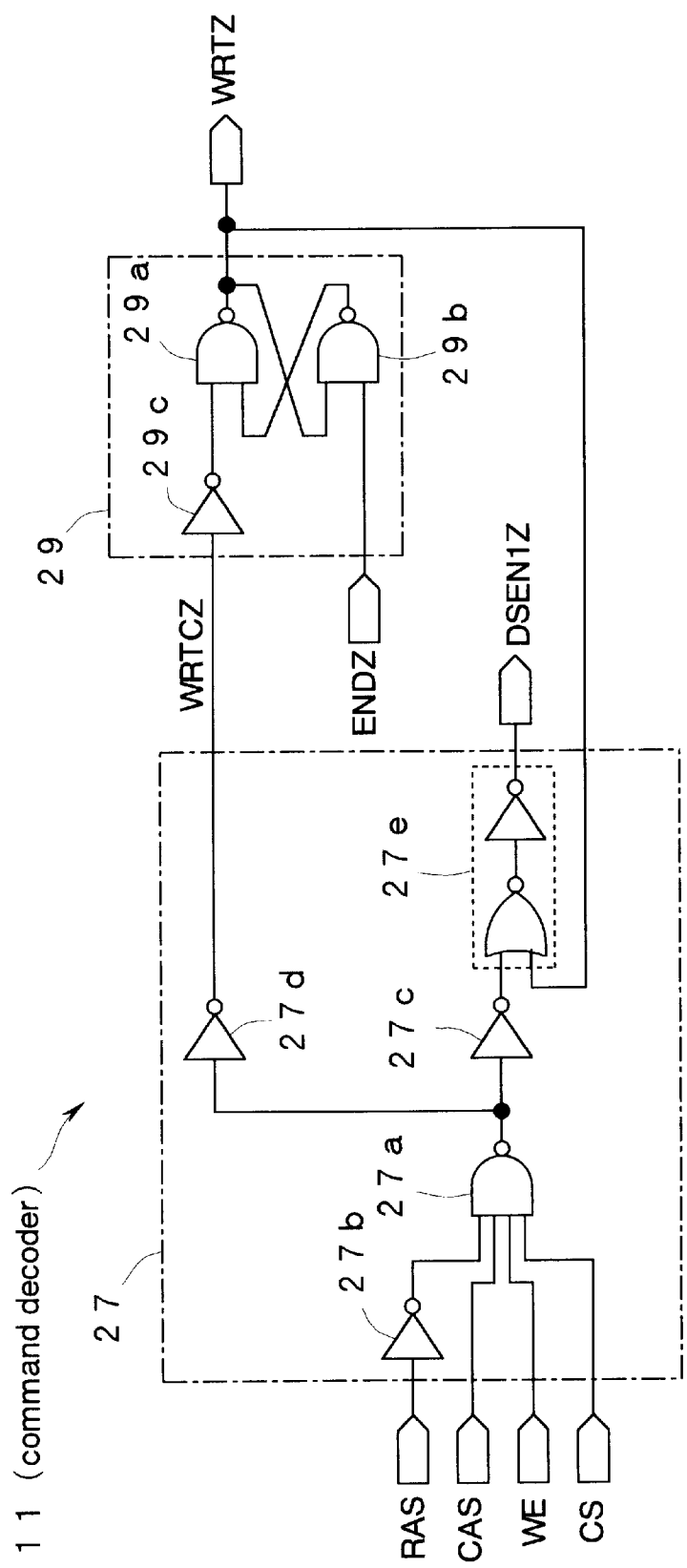
FIG. 3 is a circuit diagram showing a circuit for detecting write commands in a command decoder depicted in FIG. 2.

FIG. 3 shows a circuit for detecting write commands in the command decoder 11 of the input/output interface unit 3. The command decoder 11 includes a command detection unit 27 and a write activate signal generation unit 29.

The command detection unit 27 comprises an inverter 27b for further inverting the control signal RAS which is an inverted signal of the control signal /RAS, a four-input NAND gate 27a for receiving the output of the inverter 27b and control signals CAS, WE, CS which are inverted signals of the control signals /CAS, /WE, /CS, two inverters 27c and 27d parallel-connected to the output of the NAND gate 27a respectively, and a two-input OR circuit 27e connected to the output of the inverter 27c.

The OR circuit 27e receives the output of the inverter 27c and the write activate signal WRTZ, and outputs the activate signal DSEN1Z. The OR circuit 27e is a circuit for setting the activate signal DSEN1Z to HIGH level upon receipt of the write command, and setting the activate signal DSEN1Z to LOW level when the write activate signal WRTZ is inactivated (at the time of turning from HIGH level to LOW level).

Furthermore, the inverter 27d outputs a write command signal WRTCZ. The write command signal WRTCZ is a signal which is set to HIGH level upon receipt of the write command.

The write activate signal generation unit 29 comprises a flip-flop circuit composed of two two-input NAND gates 29a and 29b, and an inverter 29c connected to an input terminal of the NAND gate 29a.

The write activate signal generation unit 29 receives the write command signal WRTCZ at the inverter 29c, receives the count end signal ENDZ at the NAND gate 29b, and outputs the write activate signal WRTZ from the NAND gate 29a.

The write activate signal generation unit 29 is a circuit for setting, upon receipt of the leading edge of the write command signal WRTCZ, the flip-flop circuit and setting the write activate signal WRTZ to HIGH level, as well as resetting, upon receipt of the trailing edge of the count end signal ENDZ, the flip-flop circuit and setting the write activate signal WRTZ to LOW level.

Figure 4:
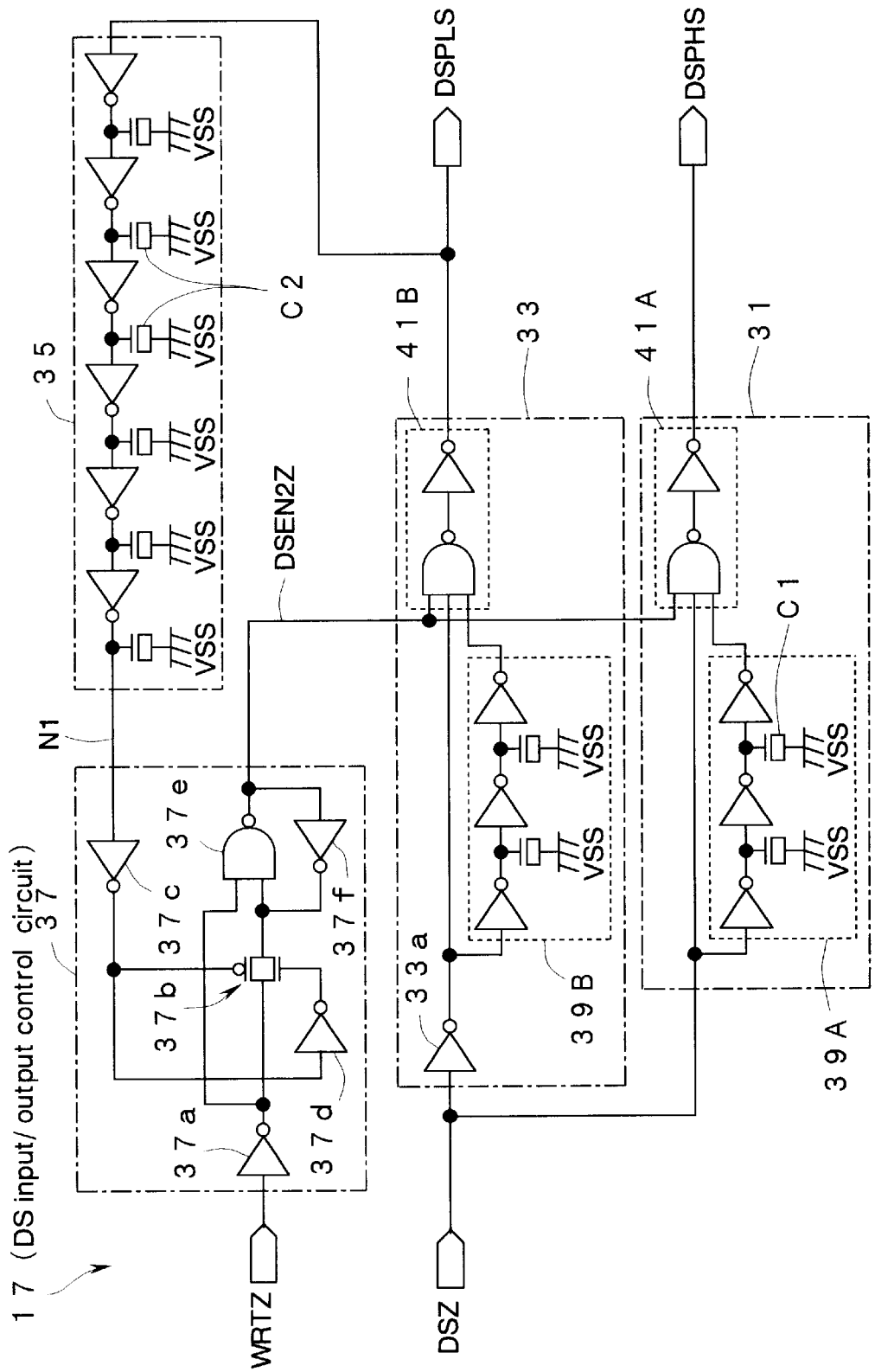
FIG. 4 is a circuit diagram showing a DS input/output control circuit depicted in FIG. 2.

FIG. 4 shows a circuit configuration of the DS input/output control circuit 17 of the interface unit 3. The DS input/output control circuit 17 includes an H edge pulse generation unit 31, an L edge pulse generation unit 33, a delay circuit 35, and a latch unit 37.

The H edge pulse generation circuit 31 comprises a delay circuit 39A and a three-input AND circuit 41A. The delay circuit 39A comprises three cascade-connected inverters and capacitors C1 disposed between the inverters.

The delay circuit 39A receives the internal data strobe signal DSZ and outputs the inverted signal of DSZ which has been delayed, to the AND circuit 41A. The AND circuit 41A receives an accept-control signal DSEN2Z outputted from the latch unit 37, the internal data strobe signal DSZ, and the output of the delay circuit 39A, and outputs the first data accept clock signal DSPHS. The H edge pulse generation unit 31 is a circuit for outputting the first data accept clock signal DSPHS in synchronization with the leading edge of the data strobe signal DS.

Here, the capacitor C1 is formed by connecting a gate terminal (referred as "gate" hereafter) of an NMOS transistor (referred to as "NMOS" hereafter) to the signal line and connecting a source terminal (referred to as "source" hereafter) and a drain terminal (referred to as "drain" hereafter) of the NMOS to a ground VSS.

The L edge pulse generation unit 33 comprises a delay circuit 39B and an AND circuit 41B, both having the same compositions as those of the H edge pulse generation unit 31, and an inverter 33a for providing an inverted signal of the internal data strobe signal DSZ to the input terminals of the delay circuit 39B and the AND circuit 41B.

The AND circuit 41B receives an accept-control signal DSEN2Z outputted from the latch unit 37, an inverted signal of the internal data strobe signal DSZ, and the output of the delay circuit 39B, and outputs the second data accept clock signal DSPLS. The L edge pulse generation unit 33 is a circuit for outputting the second data accept clock signal DSPLS in synchronization with the trailing edge of the data strobe signal DS.

A delay circuit 35 is formed by connecting capacitors C2 to each of the outputs of six the cascade-connected inverters. The capacitor C2 is formed by NMOS in a similar manner as with the capacitor C1. A delay signal N1 is a signal in the same phase as that of the second data accept clock signal DSPLS. That is, the delay circuit 35 is a circuit for outputting the delay signal N1 which is generated by delaying the second data accept clock signal DSPLS outputted from the L edge pulse generation unit 33 for a predetermined time.

The latch unit 37 comprises an inverter 37a for receiving the write activate signal WRTZ, a MOS switch 37b, inverters 37c and 37d for controlling the MOS switch 37b, a two-input NAND gate 37e, and an inverter 37f for feeding back the output signal of the NAND gate 37e to one of the input terminals.

The MOS switch 37b is formed by inter-connecting the source and drain of the NMOS and PMOS transistor (referred to as PMOS hereafter). The inverter 37c controls the gate of the PMOS, while the inverter 37d controls the gate of the NMOS. The inverter 37c receives the delay signal N1 and outputs the inverted signal of the delay signal N1 to the inverter 37d.

Furthermore, the output terminal of the inverter 37a is connected with the other input terminal of the NAND gate 37e and one end of the MOS switch 37b. The other end of the MOS switch 37b is connected to one of the input terminals of the NAND gate 37e. The NAND gate 37e outputs the accept-control signal DSEN2Z.

When the write activate signal WRTZ becomes HIGH level (activated), the latch unit 37, in response, sets the accept-control signal DSEN2Z to HIGH level (activated) regardless of the logic value of the delay signal N1. When the delay signal N1 becomes HIGH level in response to the HIGH level of the second data accept clock signal DSPLS, after the write activate signal WRTZ changes from HIGH level to LOW level (inactivated), the latch unit 37, in response, changes the accept-control signal DSEN2Z from HIGH level to LOW level (inactivated).

Figure 5:
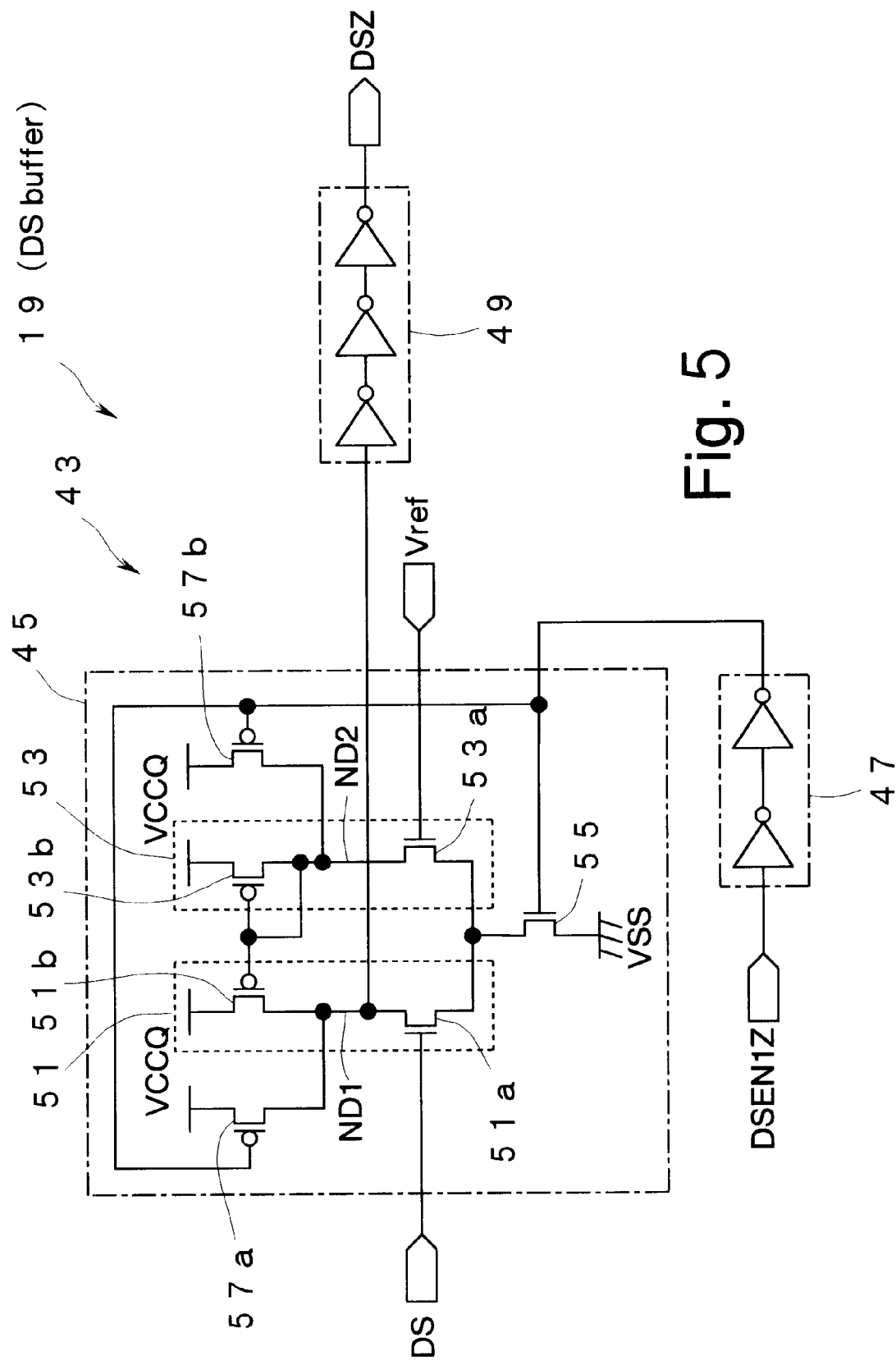
FIG. 5 is a circuit diagram showing an input buffer unit in a DS buffer depicted in FIG. 2.

FIG. 5 shows an input buffer unit 43 in the DS buffer 19 of the interface unit 3. The input buffer unit 43 includes a differential amplifier circuit 45 for comparing the data strobe signal DS inputted from the outside with the reference voltage Vref, and inverter rows 47 and 49.

In the differential amplifier circuit 45, voltage generate units 51 and 53 composed of a serial-connection of the PMOS and the NMOS are symmetrically disposed at neighboring locations. The data strobe signal DS and the reference voltage Vref are respectively supplied to the gates of the NMOS 51a and 53a of each of the voltage generate units 51 and 53. The source of the NMOS 51a and 53a are connected to the ground voltage VSS via an NMOS 55.

Furthermore, the drains of PMOS 57a and 57b are respectively connected to the nodes ND1 and ND2 connecting the NMOS 51a and 53a with the PMOS 51b and 53b of each of the voltage generate units 51 and 53. The I/O supply voltage VCCQ is supplied to the sources of the PMOS 51b and 53b, and the PMOS 57a and 57b. The node ND2 is connected to the gates of the PMOS 51b and 53b, and the voltage generate units 51 and 53 compose a current mirror circuit.

The output terminal of the inverter row 47 is connected to the gates of the NMOS 55, and the PMOS 57a and 57b. The inverter row 47 is formed by two cascade-connected inverters. The inverter row 47 receives the activate signal DSEN1Z and outputs a signal having the identical logic with that of the activate signal DSEN1Z to the differential amplifier circuit 45.

The node ND1 of the differential amplifier circuit 45 is connected to the input terminal of the inverter row 49. The inverter row 49 is formed by three cascade-connected inverters. The inverter row 49 outputs the internal data strobe signal DSZ having the identical logic with that of the data strobe signal DS.

Figure 6:
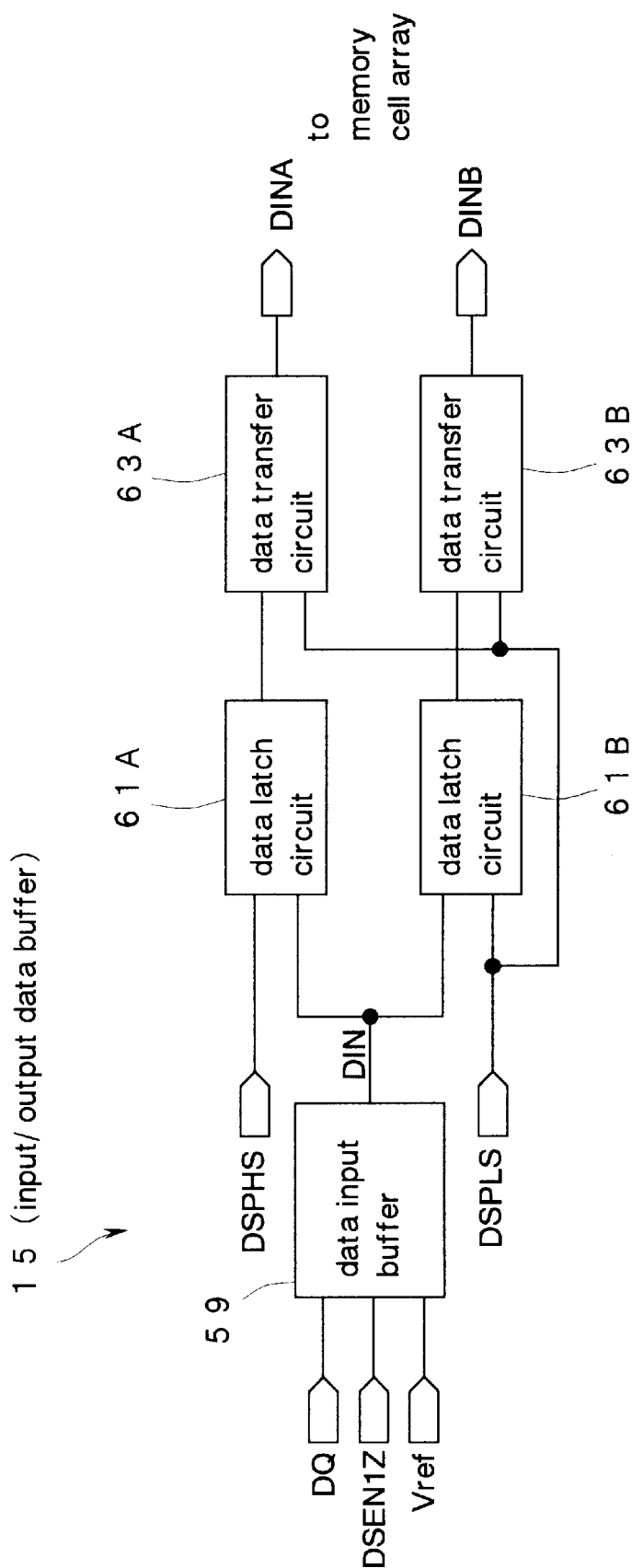
FIG. 6 is a block diagram showing an input/output data buffer depicted in FIG. 2.

FIG. 6 shows a block diagram of the input/output data buffer 15 of the interface unit 3. The input/output data buffer 15 includes a data input buffer 59, two data latch circuits 61A and 61B, and two data transfer circuits 63A and 63B.

The data input buffer 59, comprising a similar circuit to the above-described DS buffer 19, has a function of comparing the data signal DQ inputted from the outside with the reference voltage Vref, generating an internal data signal DIN having the logic corresponding to the signal value of the data signal DQ, and outputting the generated internal data signal DIN.

The data latch circuit 61A accepts the first data accept clock signal DSPHS and the internal data signal DIN, and outputs the internal data signal DIN latched in the first data accept clock signal DSPHS to the data transfer circuit 63A. The data latch circuit 61B accepts the second data accept clock signal DSPLS and the internal data signal DIN, and outputs the internal data signal DIN latched in the second data accept clock signal DSPLS to the data transfer circuit 63B.

The data transfer circuits 63A and 63B accept the data outputted from the data latch circuits 61A and 61B and the second data accept clock signal DSPLS, and output the data accepted from the data latch circuits 61A and 61B to the I/O signals DINA and DINB in synchronization with the second data accept clock signal DSPLS.

The input/output data buffer 15 has a function of accepting the data signal DQ in synchronization with both the leading edge and the trailing edge of the data strobe signal DS.

Figure 7:
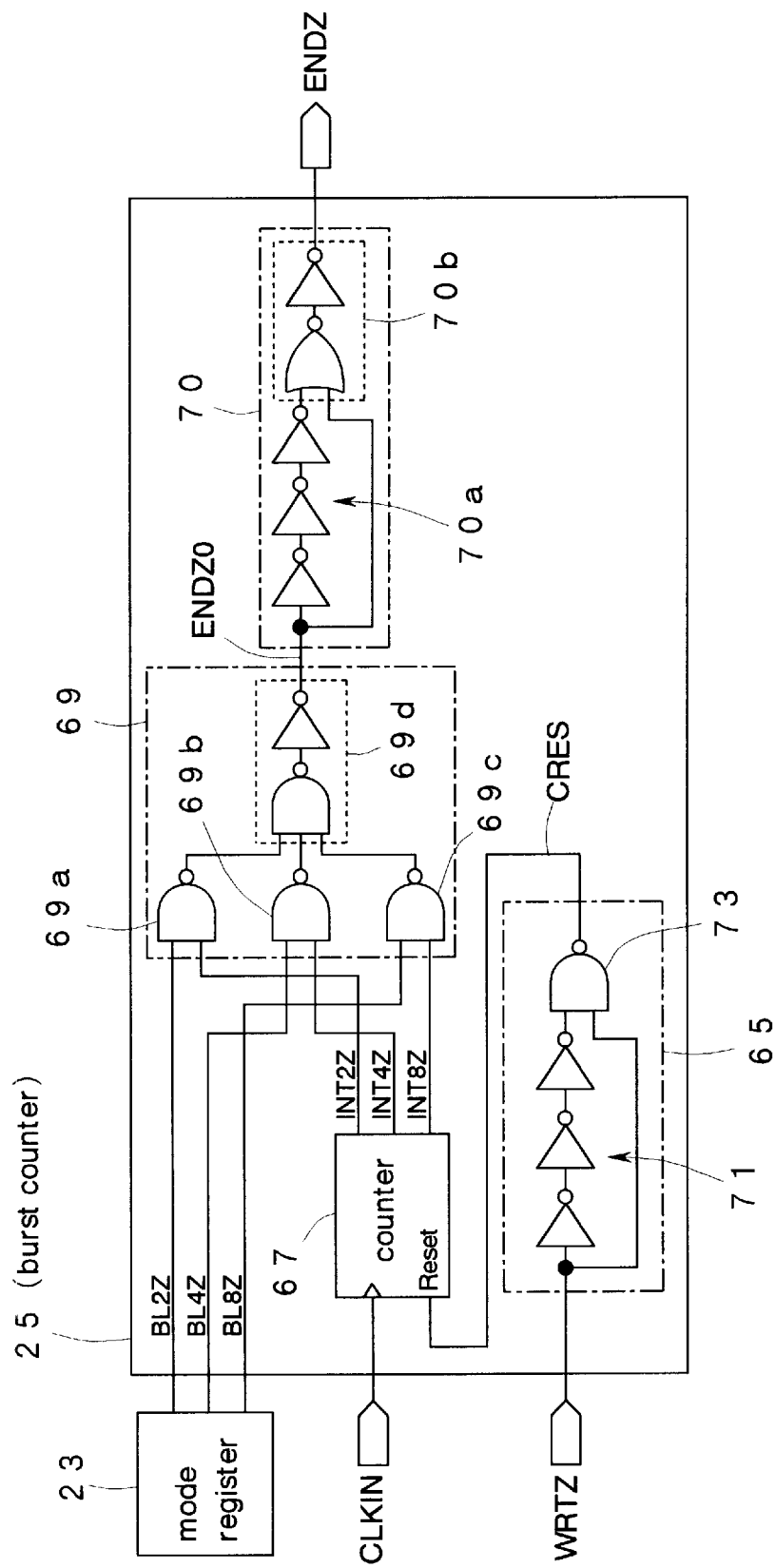
FIG. 7 is a circuit diagram showing a burst counter depicted in FIG. 2.

FIG. 7 shows a circuit configuration of the burst counter 25 of the memory control interface unit 5. The burst counter 25 includes a pulse generation circuit 65, a counter 67, a count end detection circuit 69, and a pulse generation circuit 70. The burst counter 25 also accepts the burst length information signals BL2Z, BL4Z, and BL8Z which are outputted from the mode register 23.

The pulse generation circuit 65 is formed by an inverter row 71 having three cascade-connected inverters, and a two-input NAND gate 73. The inverter row 71 receives the write activate signal WRTZ, and outputs the inverted signal of WRTZ which is delayed for a predetermined time, to one of the input terminals of the NAND gate 73. The NAND gate 73 receives the write activate signal WRTZ at the other input terminal, and outputs a counter reset signal CRES. The pulse generation circuit 65 is a circuit for generating a counter reset signal CRES (a negative logic pulse signal) at the rise of the write activate signal WRTZ.

The counter 67 receives, at the clock terminal, the internal clock signal CLKIN outputted by the clock buffer 9, also receives the counter reset signal CRES at the reset terminal, and outputs count signals INT2Z, INT4Z, and INT8Z, each of which correspond to the number of counts of the internal clock signal CLKIN. The counter 67, being counted up in synchronization with the leading edge of the internal clock signal CLKIN, has a function of setting the count signals INT2Z, INT4Z, and INT8Z to HIGH level for strictly one cycle of the internal clock signal CLKIN, each corresponding to when the internal clock signal CLKIN is counted once, twice, and four times respectively. Here, resetting of the counter 67 is done by the LOW level of the counter reset signal CRES.

The count end detection circuit 69 comprises three two-input NAND gates 69a, 69b, and 69c disposed in parallel, and an AND circuit 69d. The NAND gate 69a receives the burst length information signal BL2Z and the count signal INT2Z. Similarly, the NAND gates 69b and 69c receive the burst length information signal BL4Z and the count signal INT4Z, and the burst length information signal BL8Z and the count signal INT8Z, respectively. The AND circuit 69d, to which the output terminals of the NAND gates 69a, 69b, and 69c are connected, outputs a count match signal ENDZ0. The count end detection circuit 69 is a circuit for setting the count match signal ENDZ0 to LOW level for strictly one cycle of the internal clock signal CLKIN, when the count value of the counter 67 matches with the "burst length" set in the mode register 23.

The pulse generation circuit 70 is formed by an inverter row 70a having three cascade-connected inverters, and a two-input OR gate 70b (=a negative logic AND gate). The inverter row 70a receives the count match signal ENDZ0, and outputs the inverted signal of ENDZ0, having been delayed for a predetermined time, to one of the input terminals of the OR gate 70b. The OR gate 70b receives the count match signal ENDZ0 at the other input terminal, and outputs the count end signal ENDZ. The pulse generation circuit 70 is a circuit for generating the count end signal ENDZ (a negative logic pulse signal) upon receipt of a LOW level of the count match signal ENDZ0.

Here a counter used in general SDRAM for transferring bursts can also be used as the burst counter 25. This reduces the chip area of the semiconductor device 1 because the burst counter 25 need not be newly disposed.

In the above-mentioned semiconductor device, operation of accepting the data signals DQ successively inputted from the outside is performed as described below.

Figure 8:
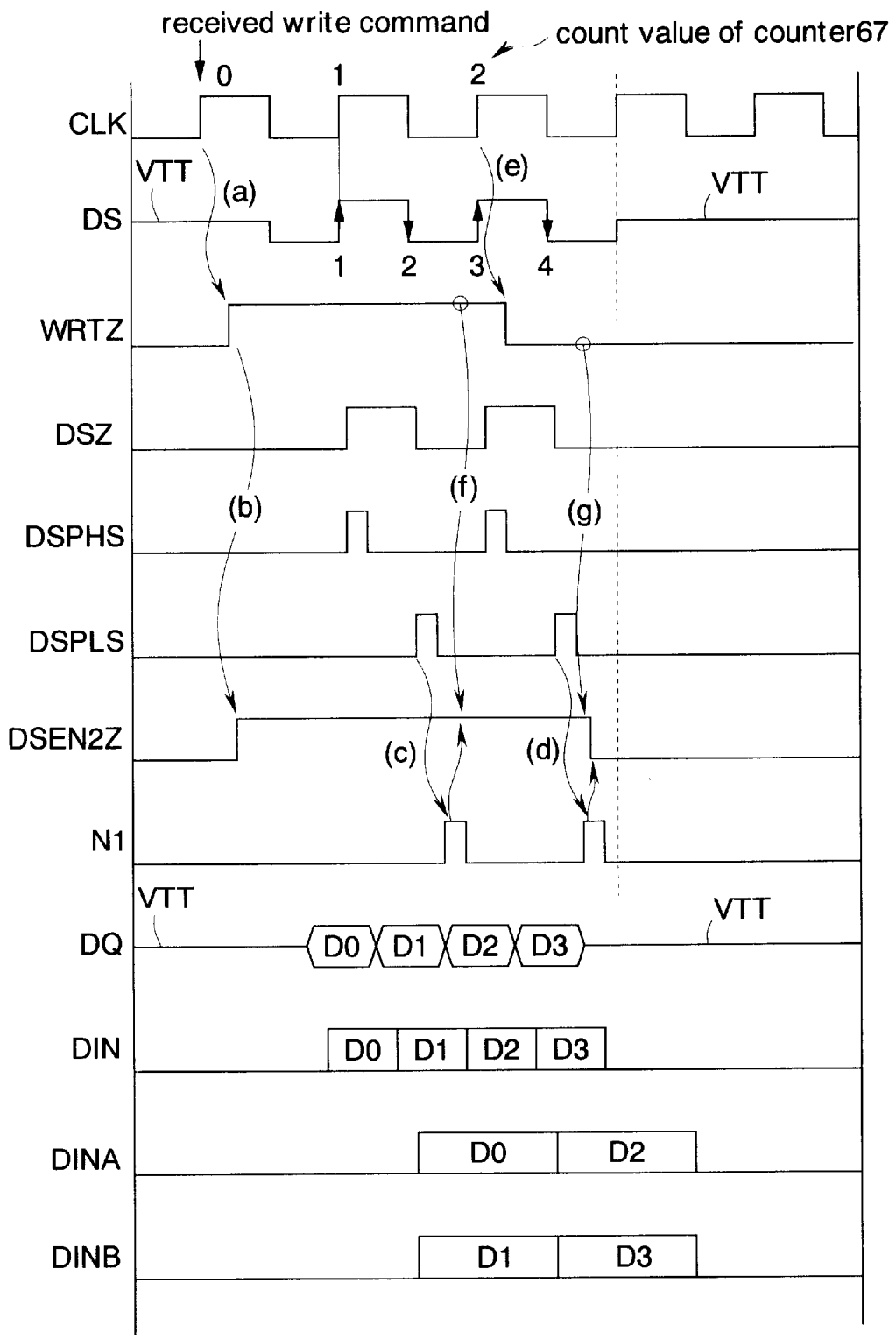
FIG. 8 is a timing chart showing an operation when data is written according to the device in FIG. 2.

FIG. 8 shows an example of the operation timing when data is being written in the first embodiment described in FIGS. 2 to 7. Here the clock signal CLK, the data strobe signal DS, and the data signals DQ are signals outputted from the CPU or the like of an information processing system, for example, including the semiconductor device 1. The data strobe signal DS and the data signals DQ are set to a high-impedance state and terminated at the termination voltage VTT when input/output operation is not being performed. Besides, in the example, the data strobe signal DS is inputted with the same phase as that of the clock signal CLK. The "burst length" is preset to "4".

Furthermore, in this example, timing is designed so that the first rise timing of the data strobe signal DS will be delayed for strictly one cycle from the rise timing of the clock signal CLK corresponding to the receipt of the write command. As described above, deviation between the phase of the data strobe signal DS and the phase of the clock signal CLK is allowed in the range of ±25%.

First, the command detection unit 27 of the command decoder 11 shown in FIG. 2 sets the write command signal WRTCZ and the activate signal DSEN1Z to HIGH level on receipt of the write command in synchronization with the leading edge of the clock signal CLK. The write activate signal generation unit 29 sets the write activate signal WRTZ to HIGH level on receipt of HIGH level of the write command WRTCZ (FIG. 8(a)). Then, in response to the setting of the write activate signal WRTZ to HIGH level, the accept-control signal DSEN2Z outputted from the latch unit 37 of FIG. 4 which will be the output permission signal of the first data accept clock signal DSPHS and the second data accept clock signal DSPLS is set to HIGH level (activated state) (FIG. 8(b)).

Next, as shown in the operation timing in FIG. 8, the data strobe signal DS is set to LOW level, after a half clock delay from the clock signal CLK having received the write command. Then, rise and fall of the data strobe signal DS is performed four times, which is the "burst length", with the same cycle and at the same timing as with the clock signal CLK. The write-data D0, D1, D2, and D3 are also inputted to the data signals DQ in synchronization with the rise and fall of the data strobe signal DS. Then, the data strobe signal DS is set to LOW level for a half clock from the trailing edge in synchronization with the final write-data D3. Then, outputting of the data strobe signal DS is stopped, the voltage of which is set to a value terminated at the terminal voltage VTT.

Additionally, setting the activate signal DSEN1Z to HIGH level activates the differential amplifier circuit 45 of the DS buffer 19 shown in FIG. 5, which generates the internal data strobe signal DSZ from the data strobe signal DS.

The first data accept clock signal DSPHS is generated in synchronization with the leading edge of the internal data strobe signal DSZ while the accept-control signal DSEN2Z is at HIGH level, by the H edge pulse generation unit 31 of the DS input/output control unit 17.

The first data accept clock signal DSPLS is generated in synchronization with the trailing edge of the internal data strobe signal DSZ while the accept-control signal DSEN2Z is at HIGH level, by the L edge pulse generation unit 33 of the DS input/output control unit 17.

The delay signal N1 is outputted after a predetermined delay time from the second data accept clock signal DSPLS by the delay circuit 35 (FIG. 8(c), (d)).

The write-data D0, D1, D2, and D3 inputted as the data signals DQ are accepted by the data input buffer 59 shown in FIG. 6 and converted into the internal data signals DIN.

Then, the write-data D0 and D2 inputted in synchronization with the leading edge of the data strobe signal DS are outputted to the data transfer circuit 63A by the data latch circuit 61A. The write-data D1 and D3 inputted in synchronization with the trailing edge of the data strobe signal DS are outputted to the data transfer circuit 63B by the data latch circuit 61B.

The I/O signals DINA accepts the write data D0 and D2 from the data transfer circuit 63A in synchronization with the second data accept clock signal DSPLS. The I/O signal DINB accepts the write data D1 and D3 from the data transfer circuit 63B in synchronization with the second data accept clock signal DSPLS.

On the other hand, the pulse generation circuit 65 of the burst counter 25 shown in FIG. 7 outputs the counter reset signal CRES (a negative logic pulse signal) on receipt of the HIGH level of the write activate signal WRTZ.

The counter 67, after being reset by the counter reset signal CRES, is counted up by the internal clock signal CLKIN each time the clock signal CLK rises.

When the count value of the counter 67 becomes "2", the count end detection circuit 69 sets the count match signal ENDZ0 to LOW level. The pulse generation circuit 70, on receipt of the LOW level of the count match signal ENDZ0, generates a negative logic pulse to the count end signal ENDZ. Then, the write activate signal generation unit 29 shown in FIG. 3, on receipt of the pulse of the count end signal ENDZ, resets the flip-flop circuit, and sets the write activate signal WRTZ to LOW level (FIG. 8(e)). Thus, the number of counts by the counter 67 in this embodiment is made to be half the "burst length". In other words, the "burst length" is twice as much as the number of counts.

Furthermore, in the latch unit 37 of the DS output control circuit 17 shown in FIG. 4, the accept-control signal DSEN2Z is in an activated state in a case where the write activate signal WRTZ is at HIGH level (activated) regardless of the logic level of the delay signal N1. Therefore, the accept-control signal DSEN2Z detects the HIGH level of the write activate signal WRTZ when the pulse of the delay signal N1 is outputted for the first time, and maintains the HIGH level state (FIG. 8(f)).

On the other hand, the accept-control signal DSEN2Z falls to LOW level at the timing of the second pulse output of the delay signal N1, after the write activate signal WRTZ fell to LOW level. That is, the accept-control signal DSEN2Z falls to LOW level when the write activate signal WRTZ is at LOW level and the delay signal N1 is at HIGH level.

Thus the H edge pulse generation unit 31 and the L edge pulse generation unit 33 are inactivated by the accept-control signal DSEN2Z which has fallen to LOW level, and the accept operation of the data signals DQ is completed.

Here the inactivate operation of the H edge pulse generation unit 31 and the L edge pulse generation unit 33 is controlled only by the delay circuit 35 and the latch unit 37. Hence, the H edge pulse generation unit 31 and the L edge pulse generation unit 33 are inactivated after approximately the same delay time as that of the delay circuit 35 from the output of the second data accept clock signal DSPLS which has accepted the final write-data D3.

Therefore, the inactivate timing of the H edge pulse generation unit 31 and the L edge pulse generation unit 33 can be easily adjusted only by adjusting the delay time of the delay circuit 35. Besides, the inactivate operation may be performed anytime while the data strobe signal DS is at LOW level (as long as about a half clock), which can be easily achieved by the above-described circuit. Accordingly, even if noise occurs in the data strobe signal DS due to influence of noise from the power source or the like after the write operation is completed, neither an erroneous first data accept clock signal DSPHS nor an erroneous second data accept clock signal DSPLS will be generated by the noise. That is, accepting an erroneous data signals DQ from the input/output data buffer 15 can be prevented.

Figure 9:
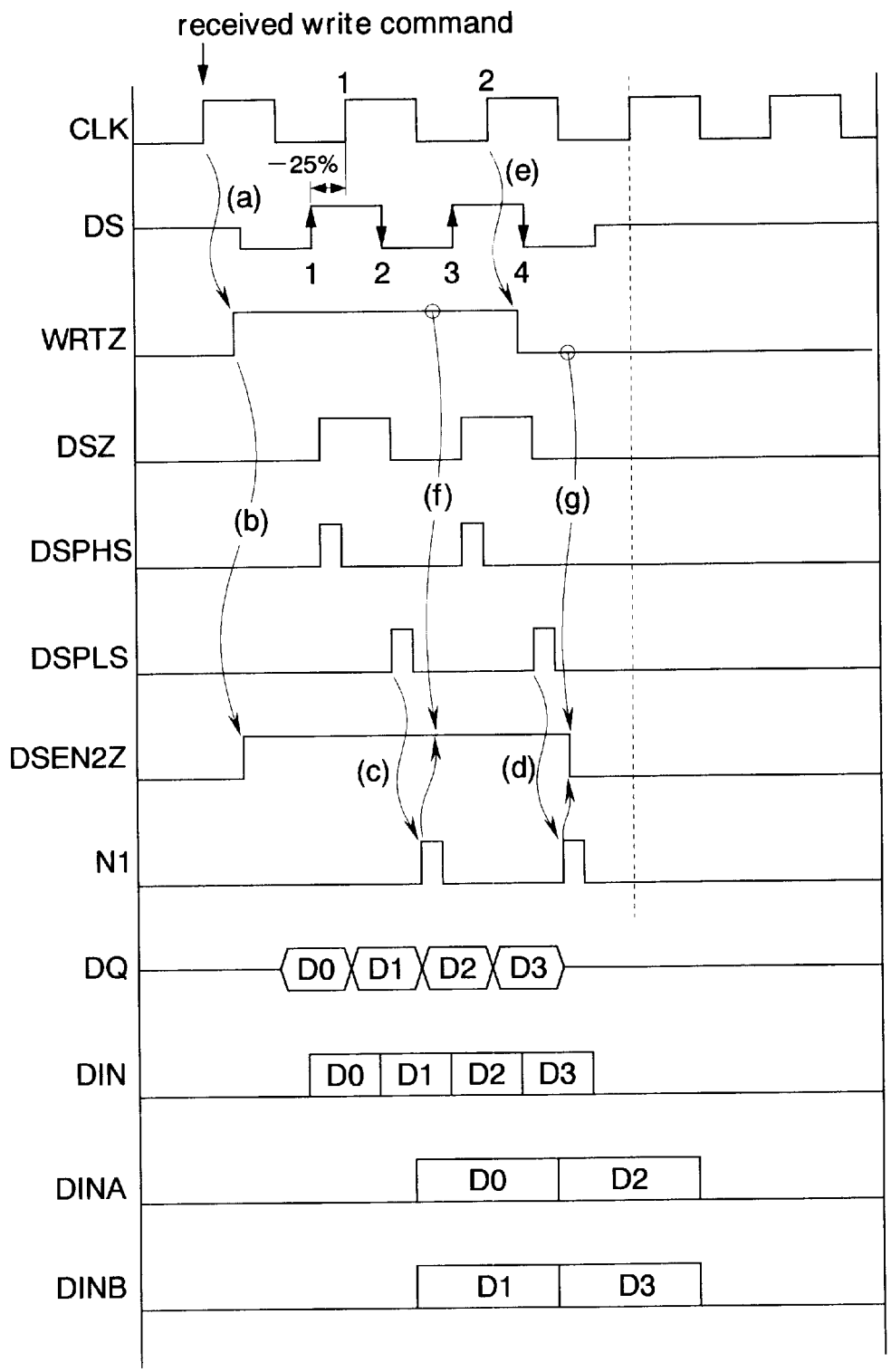
FIG. 9 is a timing chart showing an operation when data is written according to the device in FIG. 2.

FIG. 9 shows an exemplary operation timing of a write-operation where the timing of the data strobe signal DS is deviated by "−25%" relative to the clock signal CLK.

Figure 10:
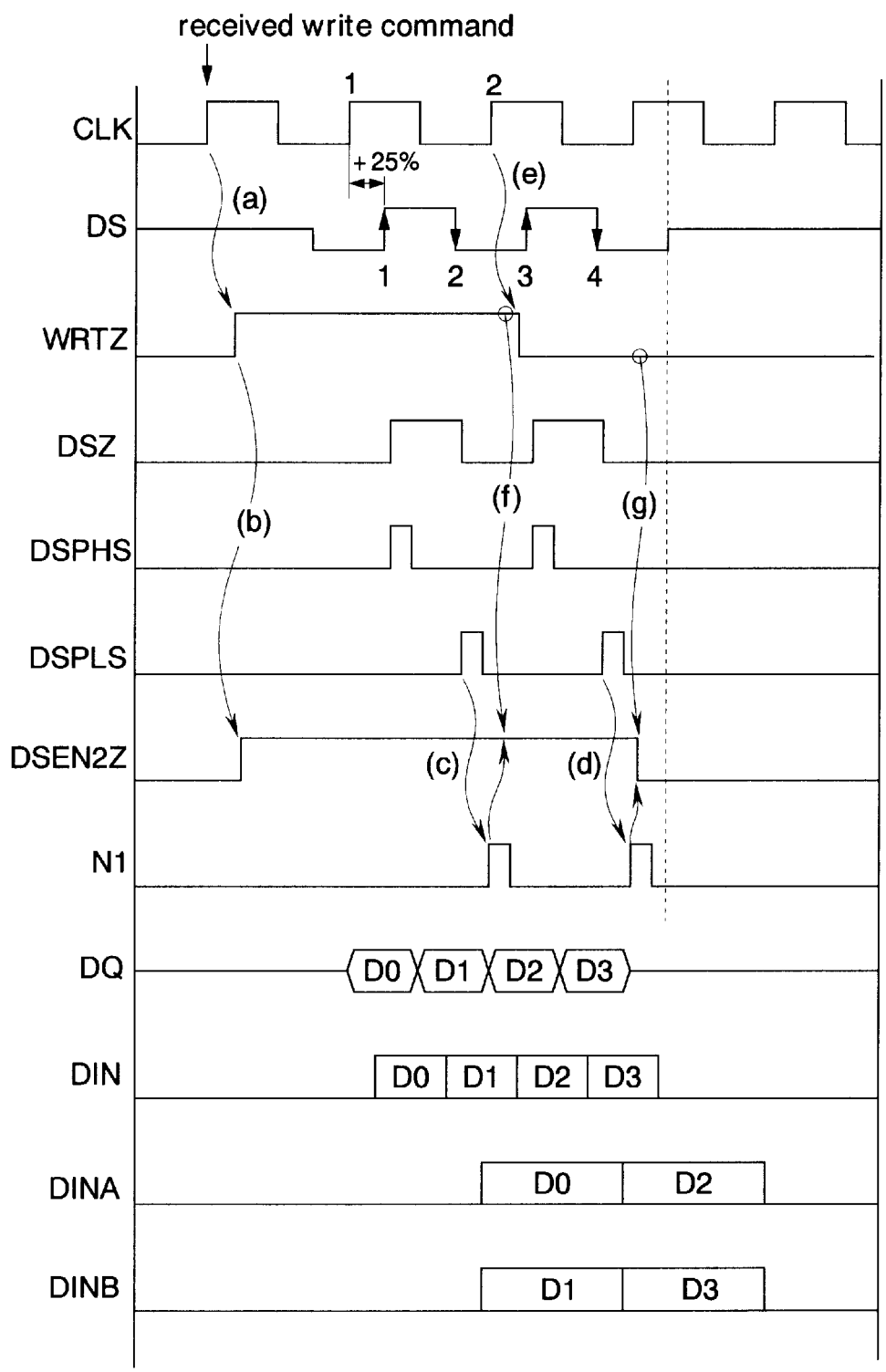
FIG. 10 is a timing chart showing an operation when data is written according to the device in FIG. 2.

FIG. 10 shows an exemplary operation timing of a write-operation where the timing of the data strobe signal DS is deviated by "+25%" relative to the clock signal CLK.

As shown in FIGS. 9 and 10, the accept-control signal DSEN2Z which inactivates the H edge pulse generation unit 31 and the L edge pulse generation unit 33 always falls to LOW level after a constant time from the output of the second data accept clock signal DSPLS. Accordingly, the H edge pulse generation unit 31 and the L edge pulse generation unit 33 will be reliably inactivated after the write-data D0 to D3 are accepted and before the data strobe signal DS is set to high impedance state, regardless of the phase deviation of the data strobe signal DS relative to the clock signal CLK.

Here, the delay time of the delay circuit 35 of FIG. 4 is set to satisfy the following conditions.

Figure 30:
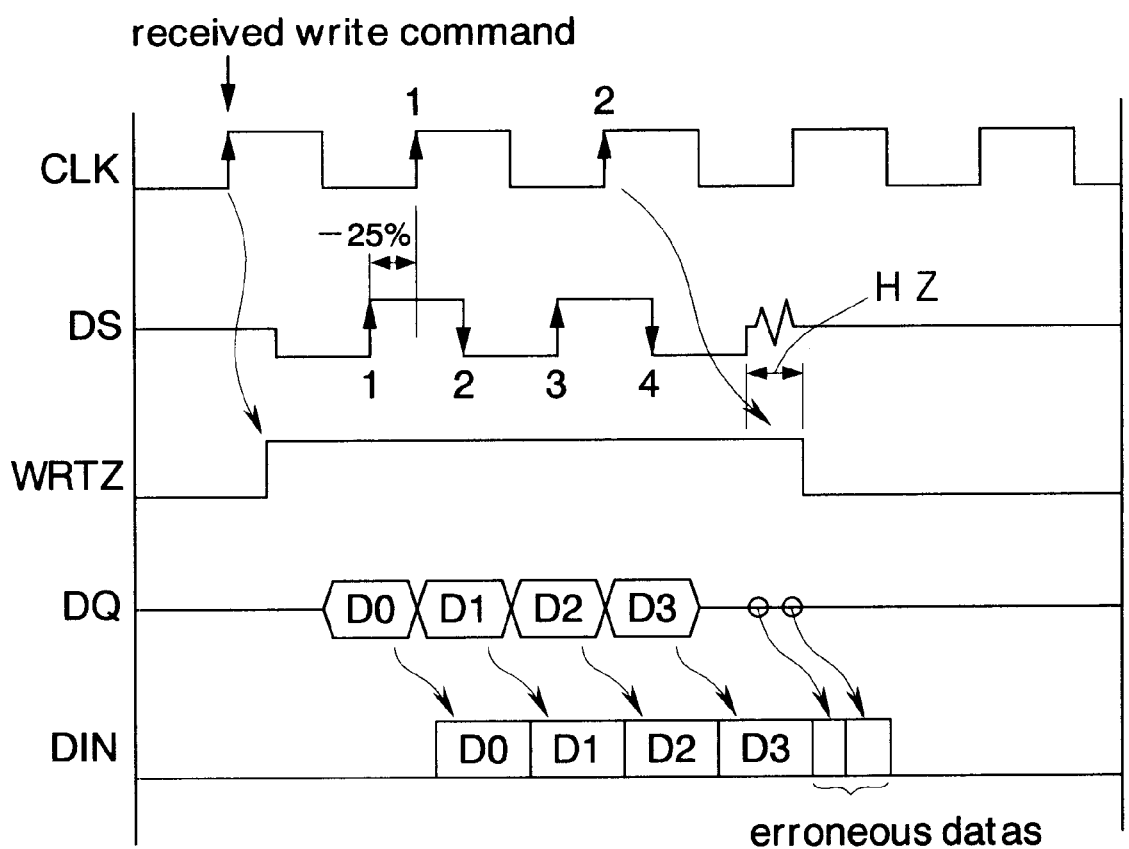
FIG. 30 is a timing chart showing a write operation of erroneous data in an SDRAM having a DS signal.

(Condition 1) To be within a half cycle of the data strobe signal DS. (If longer, the accept-control signal DSEN2Z remains at HIGH level even after the data strobe signal DS returned to the VTT level, which causes a similar problem as with FIG. 30.)

(Condition 2) The delay signal N1 generates the second pulse after the write activate signal WRTZ fell to LOW level from HIGH level, even in the case of −25% deviation shown in FIG. 9.

(Condition 3) The write activate signal WRTZ still maintains the HIGH level state at the timing when the delay signal N1 outputted the first pulse, even in the case of +25% deviation shown in FIG. 10.

In a semiconductor device composed as described above, the accept-control signal DSEN2Z is activated on receipt of the write command in synchronization with the leading edge of the clock signal CLK by the latch unit 37. Furthermore, the accept-control signal DSEN2Z is inactivated after a predetermined delay time from the second data accept clock DSPLS in synchronization with the final data signals DQ. Besides, accepting of the data signals DQ is performed by the input/output data buffer 15 while the accept-control signal DSEN2Z is activated. Hence, the accept-control signal DSEN2Z can be activated before accepting the first data signals DQ by outputting the accept-control signal DSEN2Z prior to the data strobe signal DS by approximately a half clock, when successively accepting a predetermined number of data signals DQ. Besides, the accept-control signal DSEN2Z can be inactivated, after the final data signal DQ is accepted, by the second data accept clock DSPLS which has accepted the data signals DQ. As a result, the input/output buffer 15 can accept the predetermined number of the data signals DQ with reliability.

Inactivation of the accept-control signal DSEN2Z has been controlled by the second data accept clock DSPLS generated from the data strobe signal DS. Accordingly, when timing of the data strobe signal DS varies, timing of the accept-control signal also varies in response to the variation. Hence, inactivation of the accept-control signal DSEN2Z can always be performed after the final data signal DQ is accepted, which ensures accepting of the data signals DQ. Therefore, timing allowance of the circuit can be improved, and deviation specification of the data strobe signal DS relative to the clock signal CLK can be set equal to or higher than "±25%".

Because timing of the accept-control signal DSEN2Z varies in response to timing of the data strobe signal DS, the accept-control signal DSEN2Z can always be inactivated within a predetermined time after the accepting of final data signal DQ. Thus the accept-control signal DSEN2Z will never be activated when the data strobe signal DS turns to a high impedance state after the accepting operation is completed. Therefore, even if noise occurs in the data strobe signal DS due to influence of noise from the power source or the like after the write operation is completed, it can be prevented that neither an erroneous first data accept clock signal DSPHS nor an erroneous second data accept clock signal DSPLS will be generated by the noise. That is, accepting erroneous data signals DQ from the input/output data buffer 15 can be prevented.

Furthermore, the counter 67 counts a predetermined number of clocks of the clock signal CLK, and the latch unit 37 inactivates the accept-control signal DSEN2Z in synchronization with the second data accept clock DSPLS which will vary after counting a predetermined number of the clock signals CLK. Thus, by associating the "predetermined number" of the clock signal CLK with the "number of accepted times" of the data signals DQ, the data strobe signal DS being in synchronization with the final data signal DQ can be easily and reliably detected by the counter 67.

Additionally, since the accept-control signal DSEN2Z is inactivated by the second data accept clock signal itself in synchronization with the final data signal DQ, the inactivating time from the change of the second data accept clock DSPLS to the inactivating of the accept-control signal DSEN2Z can be easily controlled by the delay time of the delay circuit 35. Thus, inactivating of the accept-control signal DSEN2Z can be controlled using a simple circuit.

As the delay time of the delay circuit 35, a short time will be sufficient for reliably accepting the final data signal DQ, which consequently reduces variation of inactivating time according to change of temperature or voltage. Therefore, timing design is facilitated, and speed-up design becomes possible when timing allowance is set to be much the same with prior arts.

Here, the delay circuit includes the H edge pulse generation unit 31 and the L edge pulse generation unit 33 for generating the first data accept clock signal DSPHS and the second data accept clock signal DSPLS which are respectively in synchronization with the leading edge and the trailing edge of the data strobe signal DS while the accept-control signal DSEN2Z is activated and being outputted, and the input/output data buffer 15 for accepting the data signals DQ in synchronization with the first and the second data accept clock signals DSPHS and DSPLS respectively. Therefore, a DDR type semiconductor device for accepting the data signals DQ in synchronization with both the leading edge and the trailing edge of the data strobe signal DS can easily and reliably detect the data strobe signal in synchronization with the final data signal DQ.

Furthermore, since the number of the data signals DQ to be accepted is set to be twice as much as the predetermined number of the clock signals CLK counted by the counter 67, a DDR type semiconductor device for accepting the data signals DQ in synchronization with both the leading edge and the trailing edge of the data strobe signal DS can detect the data strobe signal in synchronization with the final data signal by counting the clock signal CLK with the counter 67.

Now, because the accept-control signal DSEN2Z is inactivated by counting the clock signal CLK with the counter 67, a counter used for transferring bursts in general SDRAM can be used. In this case, the chip area of the semiconductor device 1 can be reduced because the burst counter 25 need not be newly disposed.

Figure 11:
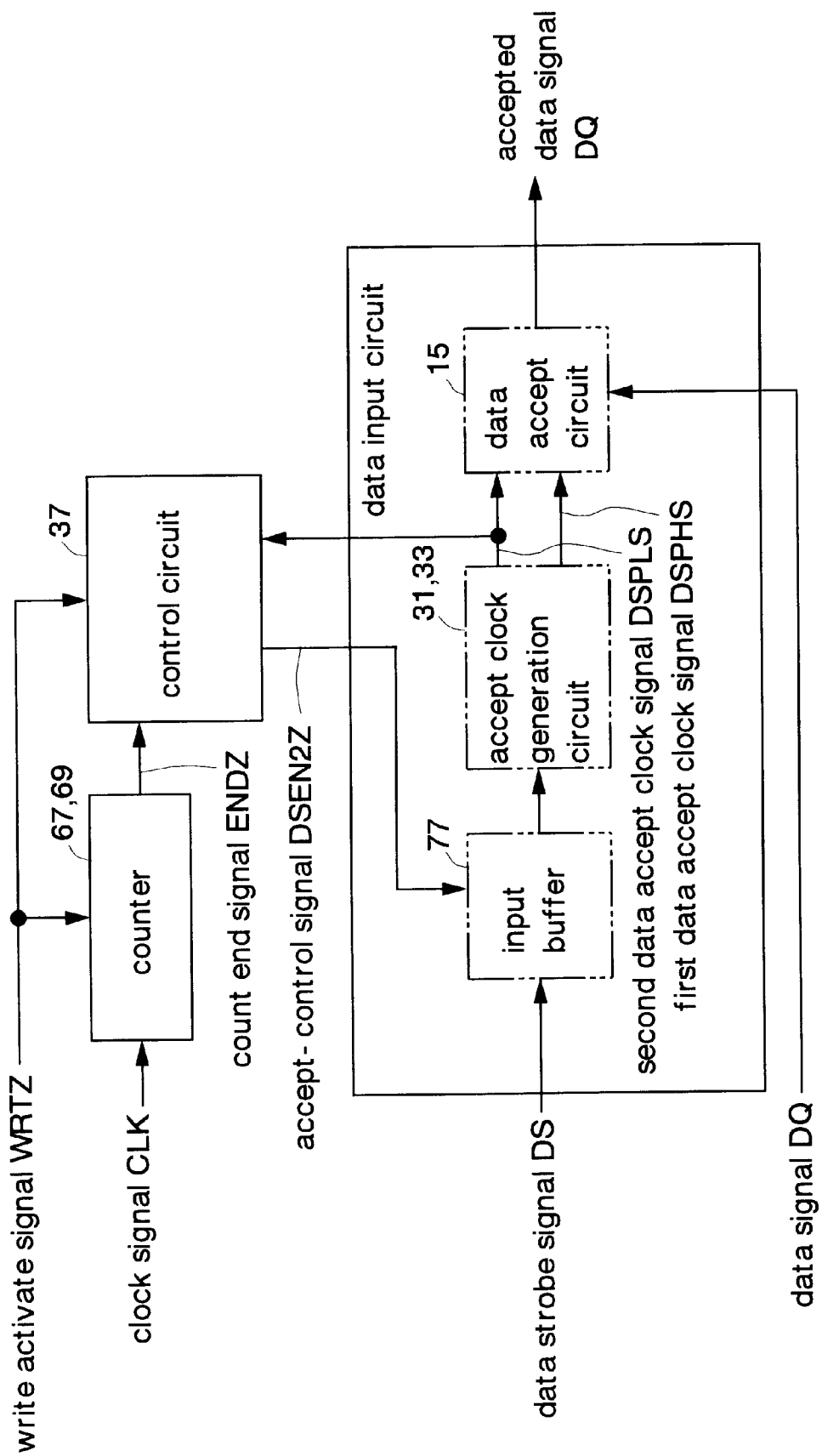
FIG. 11 is a block diagram showing the basic principle of a second embodiment of a semiconductor device according to the present invention.

FIG. 11 is a block diagram showing the basic principle of a second embodiment of the semiconductor device according to the present invention, wherein the device comprises a counter, a control circuit, and a data input circuit all of which are identical to those in FIG. 1 (the first embodiment). The data input circuit includes an input buffer, and an accept clock generation circuit and a data accept circuit which are identical to those in FIG. 1.

The input buffer is circuit corresponding to a DS buffer 77 which will be described below. The accept-control signal DSEN2Z generated by the control circuit is inputted to the input buffer. However, unlike FIG. 1, the accept-control signal DSEN2Z is not inputted to the accept clock generation circuit.

Figure 12:
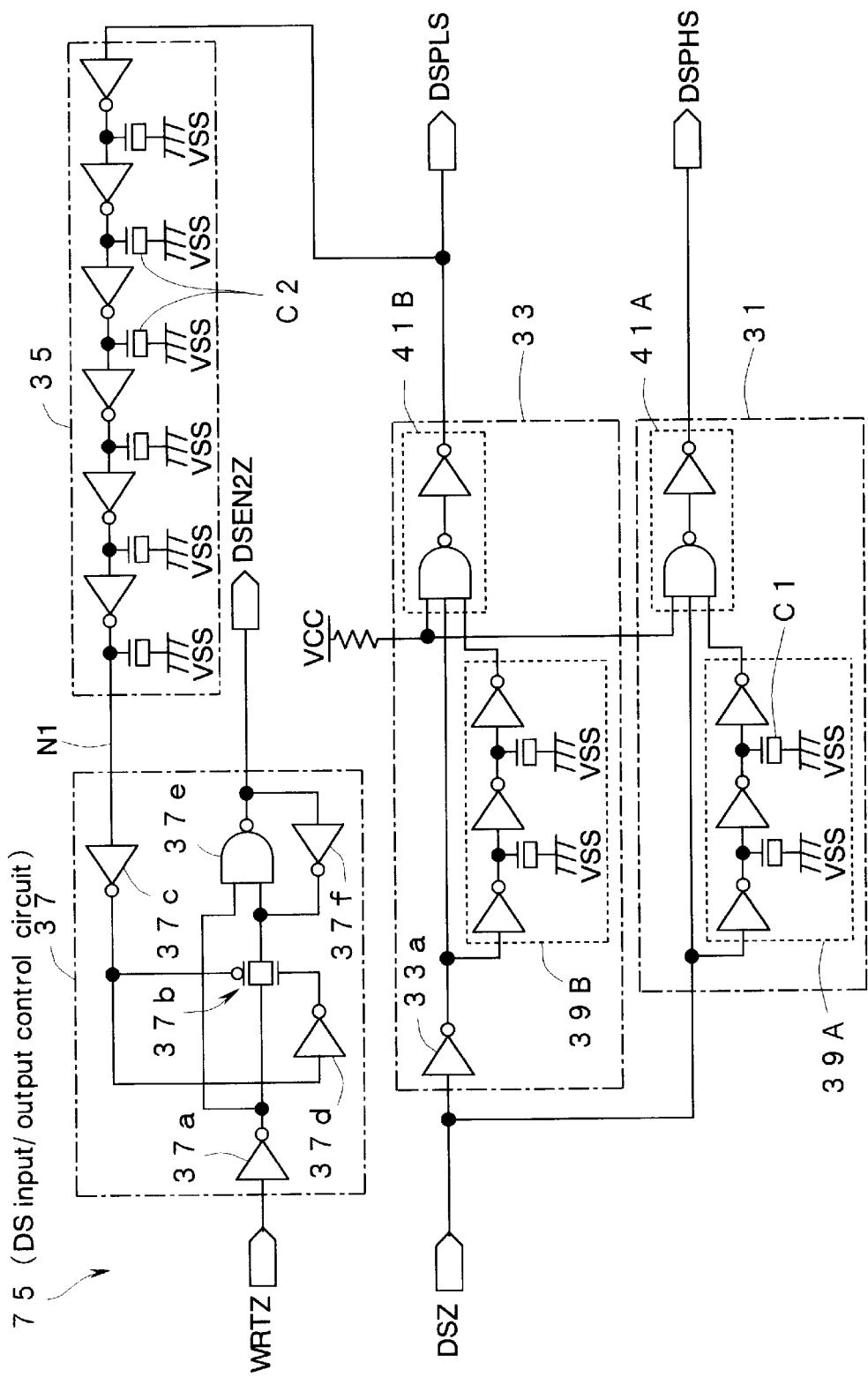
FIG. 12 is a circuit diagram showing a DS input/output control circuit in the second embodiment of a semiconductor device according to the present invention.
Figure 13:
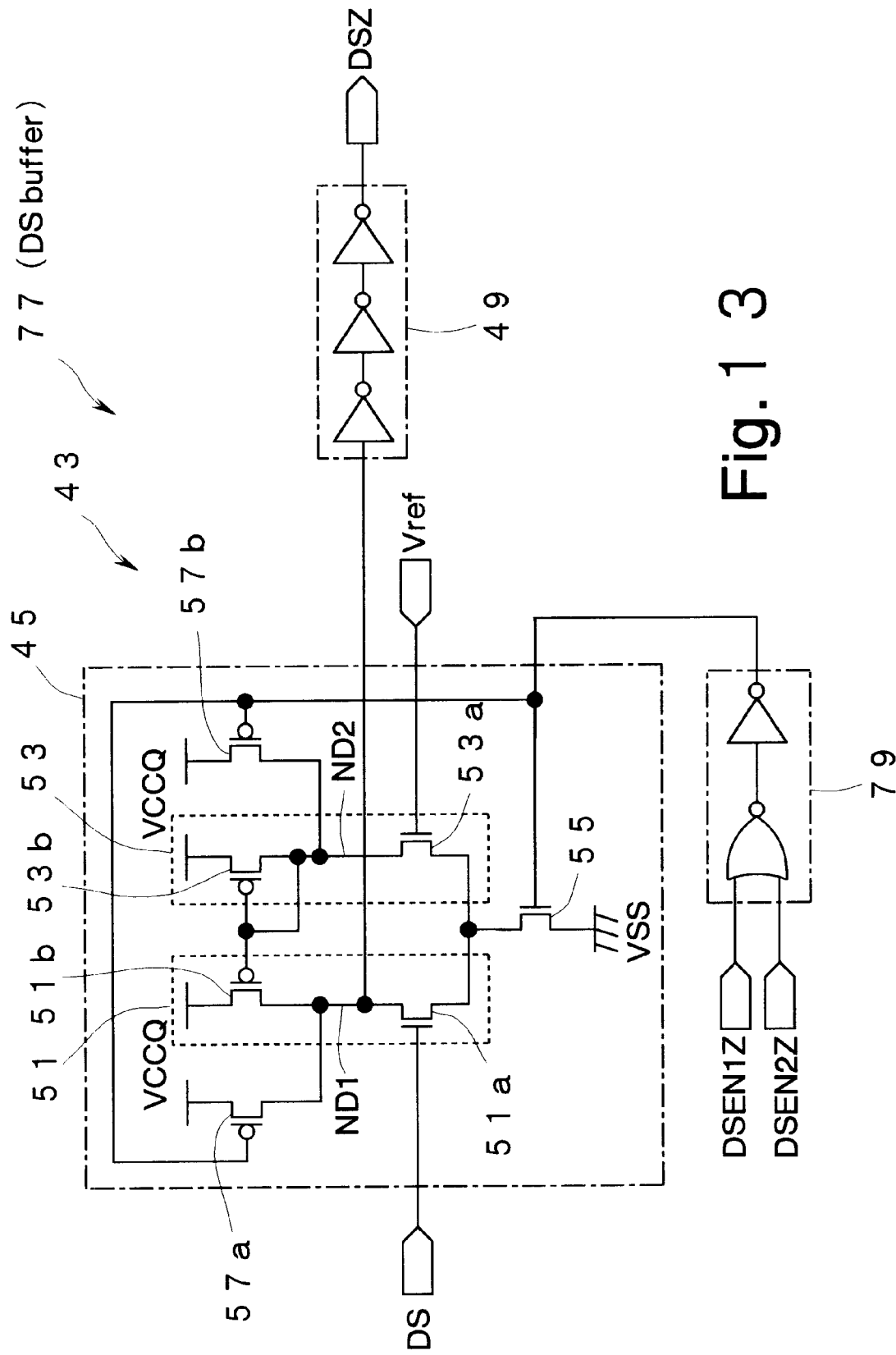
FIG. 13 is a circuit diagram showing a DS buffer in the second embodiment of a semiconductor device according to the present invention.

FIGS. 12 and 13 show circuit configurations of a DS input/output control circuit 75 and the DS buffer 77 according to the second embodiment.

In this embodiment, the accept-control signal DSEN2Z is not connected to input terminals of the AND circuit 41A of the H edge pulse generation unit 31 and the AND circuit 41B of the L edge pulse generation unit 33 in FIG. 12. The input terminals of the AND circuit 41A and the AND circuit 41B in the first embodiment which receive the accept-control signal DSEN2Z are pulled-up to the supply voltage VCC. Here the accept-control signal DSEN2Z is used for activating the differential amplifier circuit 45 in FIG. 13. The components except for the H edge pulse generation unit 31, the L edge pulse generation unit 33, and the differential amplifier circuit 45 are identical with those in the above-described first embodiment.

Namely, in FIG. 13, the output of a two-input OR circuit 79 is connected to the gates of PMOS 57a and 57b, and an NMOS 55 in order to activate the differential amplifier circuit 45. Here the OR circuit 79 receives the activate signal DSEN1Z and the accept-control signal DSEN2Z.

In this embodiment, the DS buffer 77 is inactivated by the accept-control signal DSEN2Z which falls to LOW level on receipt of a LOW level of the write activate signal WRTZ at the timing of the second output of the delay signal N1. This is, the DS buffer 77 is inactivated after approximately the same delay time as that of the delay circuit 35 from the output of the second data accept clock signal DSPLS which has accepted the final write-data D3.

A similar effect with that in the first embodiment mentioned above can also be obtained in the semiconductor device of this embodiment. In this embodiment, however, since the DS buffer 77, which is the entrance of the data strobe signal DS in the semiconductor device 1, is inactivated by the accept-control signal DSEN2Z, even if noise is generated in the data strobe signal DS due to influence of noise from the power supply or the like, the noise will not be transmitted to internal circuits. As a result, malfunction of internal circuits is prevented, and unnecessary power consumption due to malfunction can also be prevented.

Figure 14:
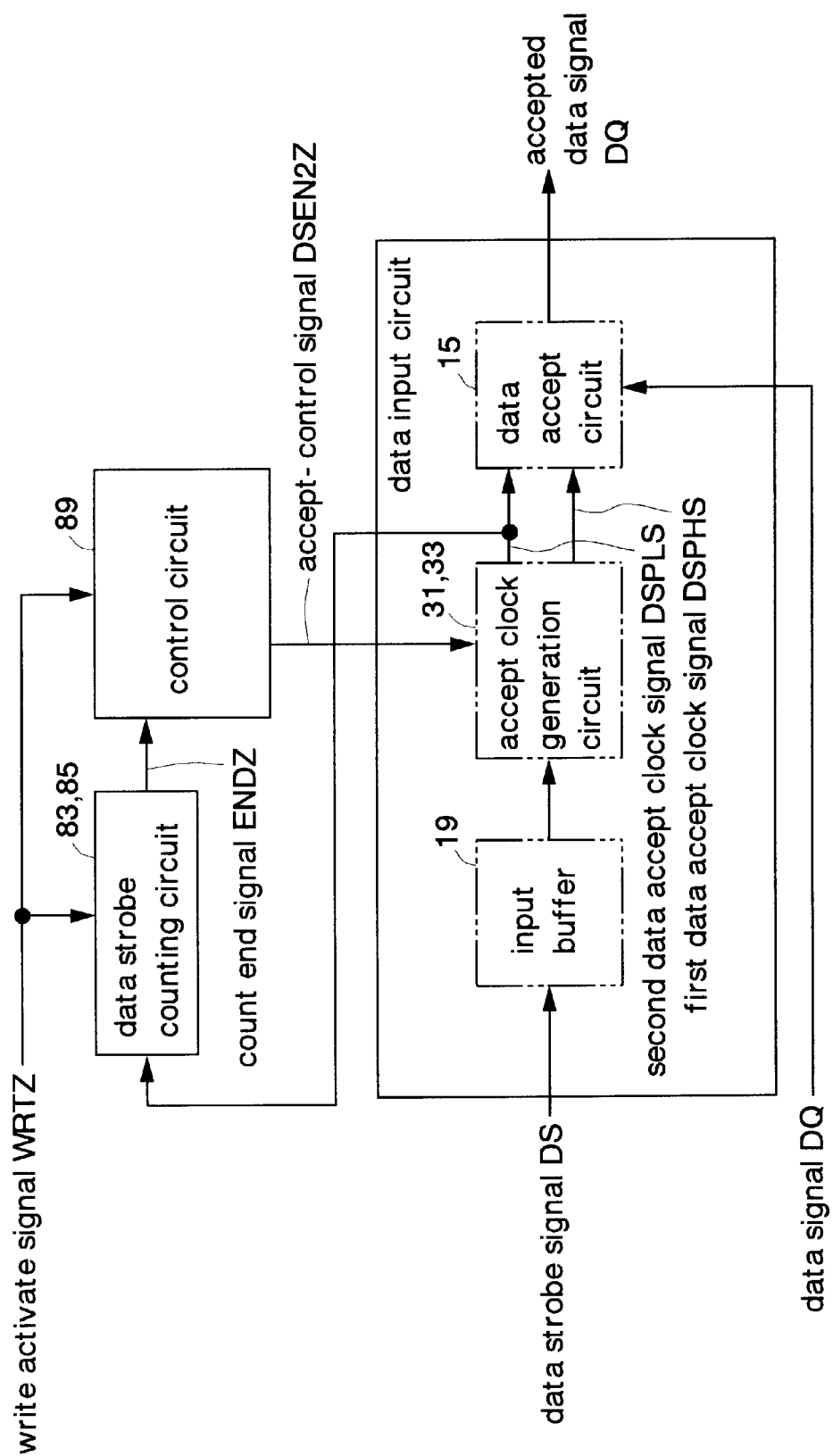
FIG. 14 is a block diagram showing the basic principle of a third embodiment of a semiconductor device according to the present invention.

FIG. 14 is a block diagram showing the basic principle of a third embodiment of a semiconductor device according to the present invention, wherein the device comprises a data strobe counting circuit, a control circuit, and a data input circuit.

The data strobe counting circuit is the circuit corresponding to a counter 83 and a count end detection circuit 85, which will be described below. The control circuit is a circuit corresponding to a write activate signal control unit 89, which will be described below.

The data strobe counting circuit has a function of counting a predetermined number of the second data accept clock signals DSPLS after the write activate signal WRTZ is activated, generating and outputting the count end signal ENDZ2 after the counting is completed. Here the second data accept clock signal DSPLS is used as a signal in place of the data strobe signal DS.

The control circuit has a function of activating the accept-control signal DSEN2Z when the write activate signal WRTZ is activated, and inactivating the accept-control signal DSEN2Z after receiving the count end signal ENDZ2 and further receiving the second data accept clock signal DSPLS.

The data input circuit comprises an input buffer, an accept clock generation circuit, and a data accept circuit which are identical with that in FIG. 1 (the first embodiment).

Figure 15:
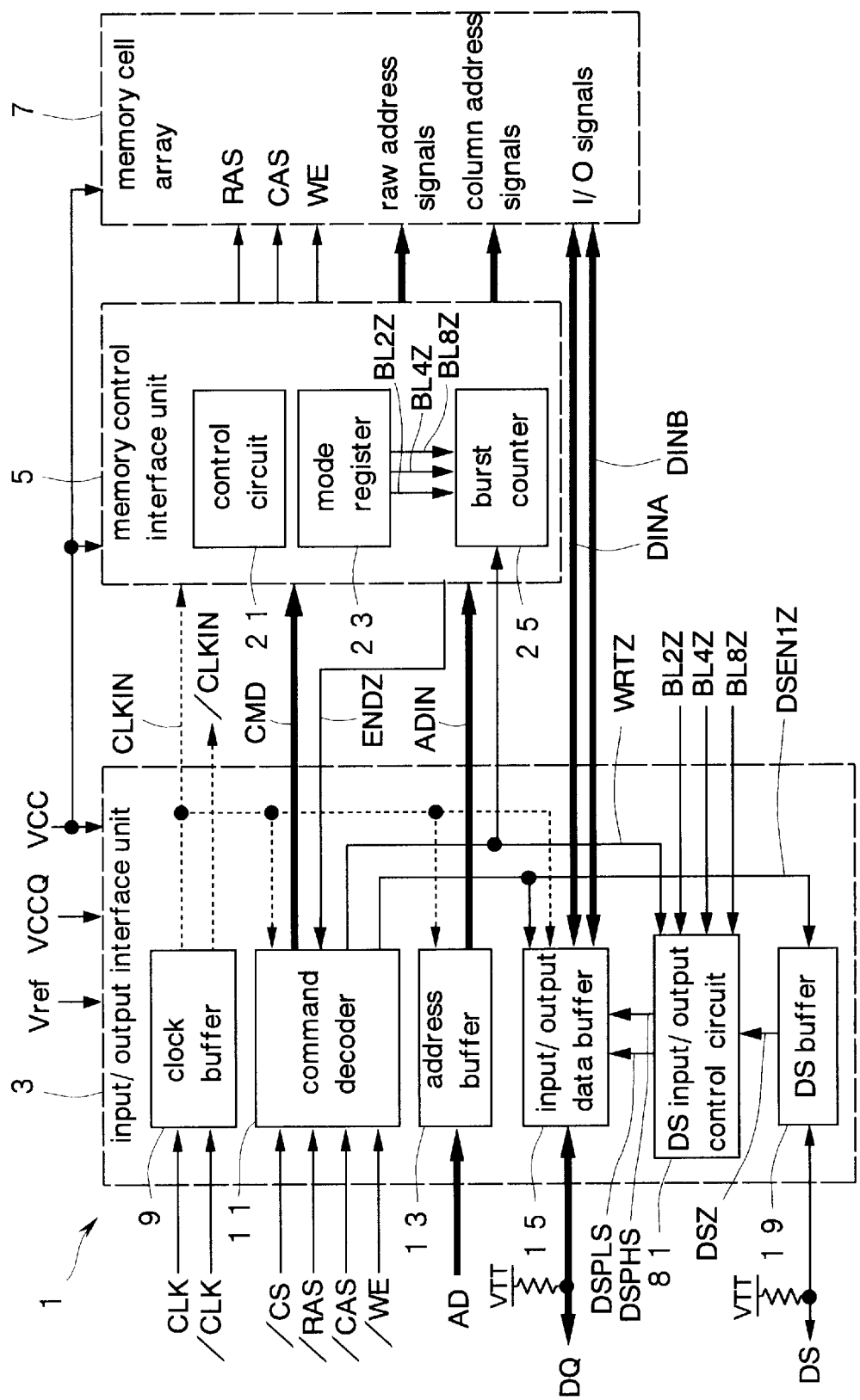
FIG. 15 is a general diagram showing the third embodiment of a semiconductor device according to the present invention.

FIG. 15 shows a third embodiment of a semiconductor device according to the present invention.

In this embodiment, burst length information signals BL2Z, BL4Z, and BL8Z which are outputted from the mode register 23 are inputted to a DS input/output control circuit 81 of the input/output interface unit 3. The components except for the DS input/output control circuit 81 are identical with those in the first embodiment mentioned above.

Figure 16:
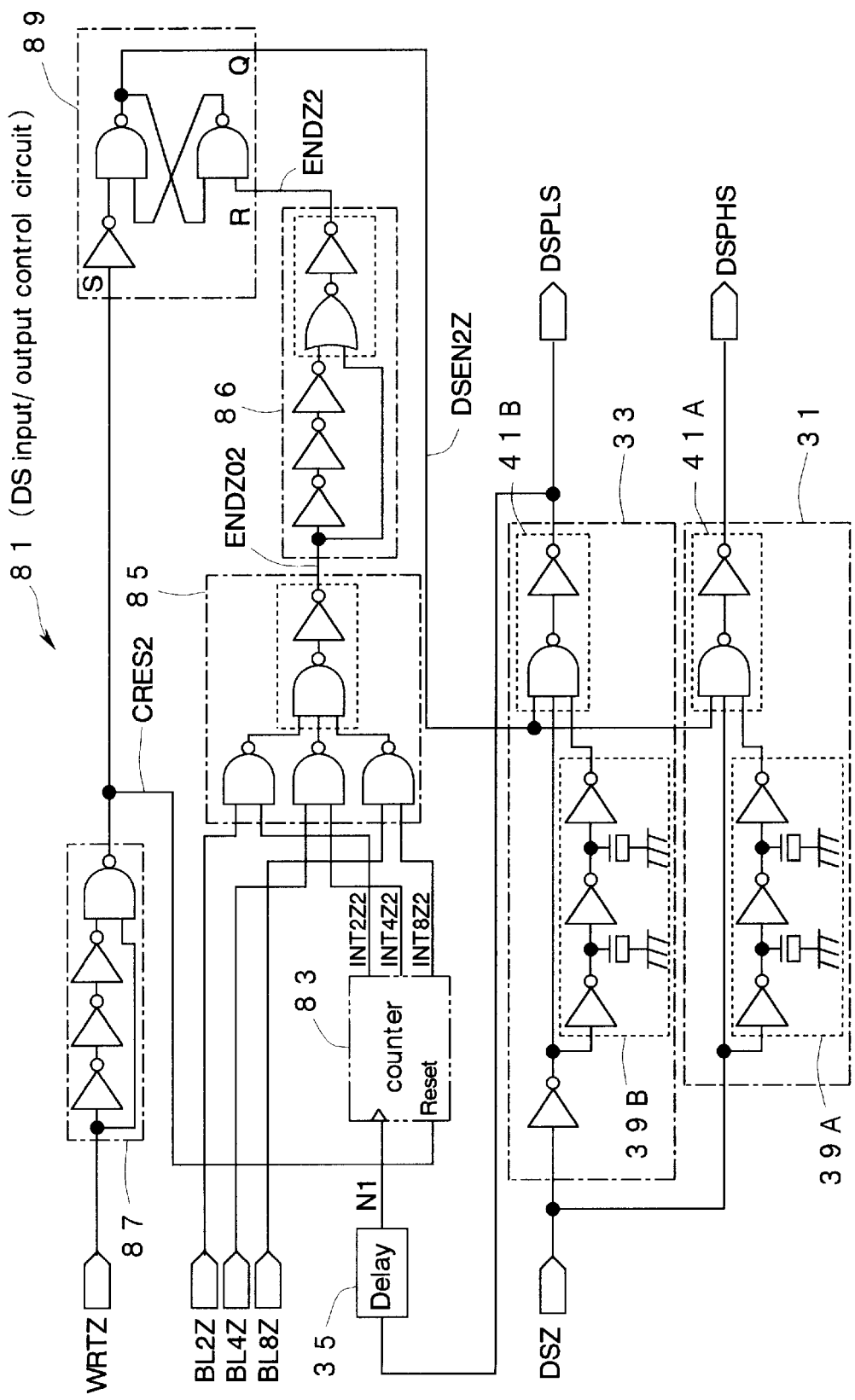
FIG. 16 is a circuit diagram showing a DS input/output control circuit depicted in FIG. 15.

FIG. 16 shows a circuit configuration of the DS input/output control circuit 81. The DS input/output control circuit 81 includes the H edge pulse generation unit 31, the L edge pulse generation unit 33, the delay circuit 35, a counter 83, a count end detection circuit 85, a pulse generation circuit 86, a pulse generation circuit 87, and a write activate signal control unit 89.

The H edge pulse generation unit 31, the L edge pulse generation unit 33, and the delay circuit 35 are identical circuits with those composing the DS input/output control circuit 17 of the first embodiment. The counter 83, the count end detection circuit 85, the pulse generation circuit 86, and the pulse generation circuit 87 are identical circuits with the counter 67, the count end detection circuit 69, the pulse generation circuit 70, and the pulse generation circuit 65 in the burst counter 25 of the first embodiment, respectively. The write activate signal control unit 89 is an identical circuit with the write activate signal control unit 29 in the command decoder 11 of the first embodiment.

The counter 83 receives, at the clock terminal, the delay signal N1 outputted from the delay circuit 35, and receives, at the reset terminal, the counter reset signal CRES2 outputted from the pulse generation circuit 87. The counter 83 also outputs count signals INT2Z2, INT4Z2, and INT8Z2, each of which corresponds to the number of counts.

The count end detection circuit 85 receives, in a similar manner as with the first embodiment, the burst length information signals BL2Z, BL4Z, and BL8Z, and the count signals INT2Z2, INT4Z2, and INT8Z2, and outputs a count match signal ENDZ02.

The pulse generation circuit 89 receives the count match signal ENDZ02 and outputs a count end signal ENDZ2.

The write activate signal control unit 89 receives the counter reset signal CRES2 at the set terminal S, and receives the count end signal ENDZ2 at the reset terminal R. The write activate signal control unit 89 outputs the accept-control signal DSEN2Z from the output terminal Q.

The accept-control signal DSEN2Z is connected to the input terminals of the AND circuit 41A of the H edge pulse generation unit 31 and the AND circuit 41B of the L edge pulse generation unit 33.

Figure 17:
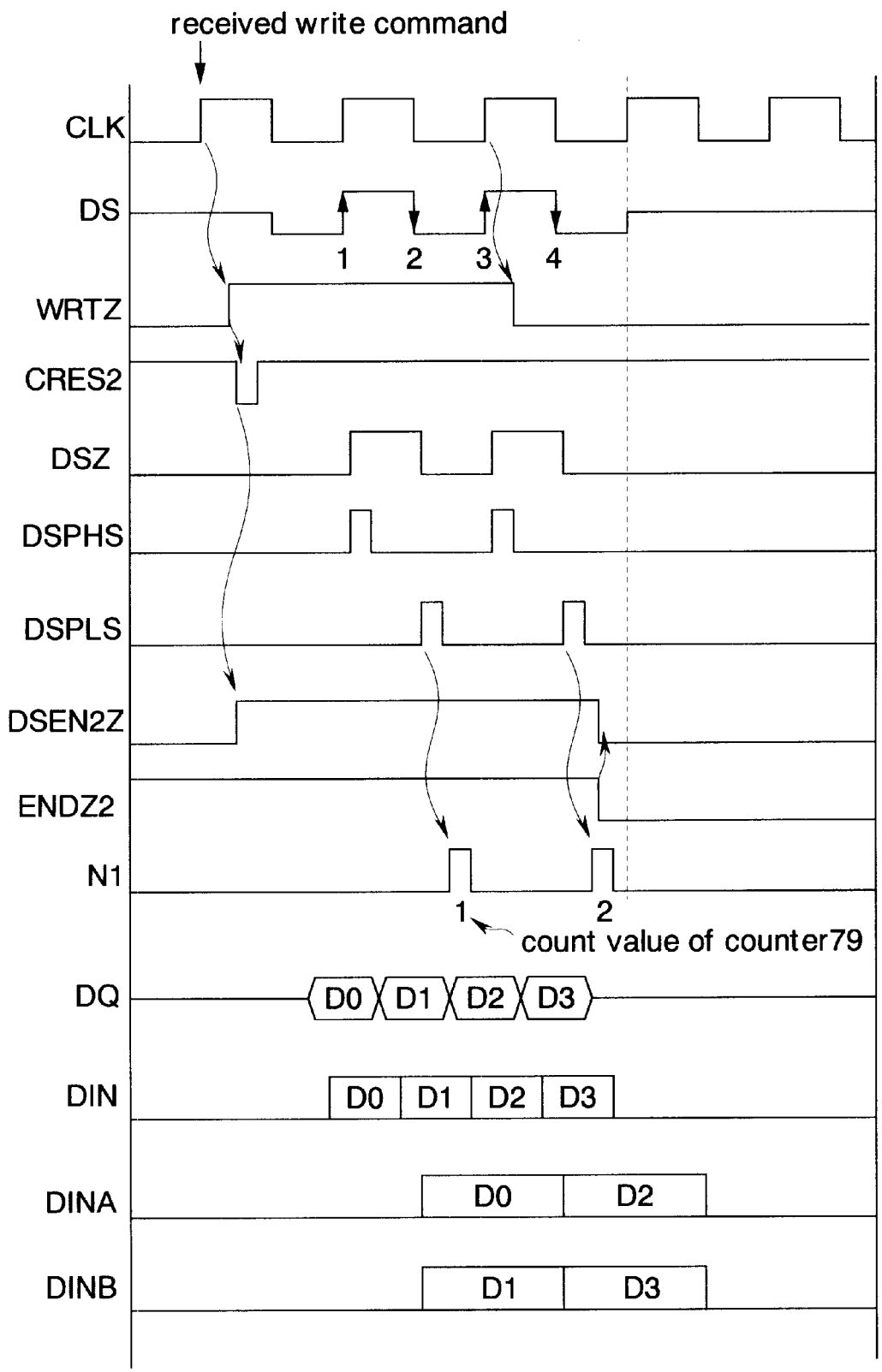
FIG. 17 is a timing chart showing an operation when data is written according to the device in FIG. 15.

In the above-mentioned semiconductor device 1 the accept operation of the data signals DQ which is successively inputted from the outside is performed as shown in FIG. 17.

First, the semiconductor device 1 turns the write activate signal WRTZ to HIGH level on receipt of the write command. The change of the write activate signal WRTZ to HIGH level generates the counter reset signal CRES2 (a negative logic pulse signal), setting the accept-control signal DSEN2Z to HIGH level. At the same time, the counter 83 is reset by the counter reset signal CRES2.

The H edge pulse generation unit 31 and the L edge pulse generation unit 33 are activated by the change of the accept-control signal DSEN2Z to HIGH level. Then, the first data accept clock signal DSPHS and the second data accept clock signal DSPLS are generated in synchronization with the data strobe signal DS, and the write-data D0 to D3 are sequentially accepted.

The counter 83 is counted up at the leading edge of the delay signal N1 which has been delayed for strictly the delay time of the delay circuit 35 from the second data accept clock signal DSPLS. Then, the count end signal ENDZ2 is set to LOW level by the count end detection circuit 85 when the second leading edge of the delay signal N1 is counted.

The write activate signal control unit 89 is reset on receipt of a negative logic pulse of the count end signal ENDZ2, and sets the accept-control signal DSEN2Z to LOW level. Then, the falling of the accept-control signal DSEN2Z to LOW level inactivates the H edge pulse generation unit 31 and the L edge pulse generation unit 33.

A similar effect with that in the first embodiment mentioned above can also be obtained in the semiconductor device of this embodiment. In this embodiment, however, the counter 83 counts a predetermined number of the second data accept clocks DSPLS generated from the data strobe signal DS, and the write activate signal control unit 89 inactivates the accept-control signal DSEN2Z after the predetermined number of the second data accept clocks DSPLS is counted. Thus, by associating the "predetermined number" of the second data accept clock DSPLS with the "number of accepted times" of the data signals DQ, the data strobe signal DS being in synchronization with the final data signal DQ can be easily and reliably detected by the counter 83.

Furthermore, since the final data signal DQ is accepted when counting the predetermined number of the second data accept clock signals DSPLS, the final data signal can be reliably accepted by only inactivating the accept-control signal DSEN2Z after a slight delay from the second data accept clock signal DSPLS, using the delay circuit 35 or the like.

Thus, the post-counting control can be performed in a shorter time than in the case with counting the data strobe signal DS because the second data accept clock signal DSPLS for accepting the data signals DQ is directly counted by the counter 83, which allows a delay circuit with a short delay time to be used for the controlling. As a result, deviation of timing according to change of temperature or voltage is reduced, which achieves accurate control of inactivating the accept-control signal DSEN2Z.

Figure 18:
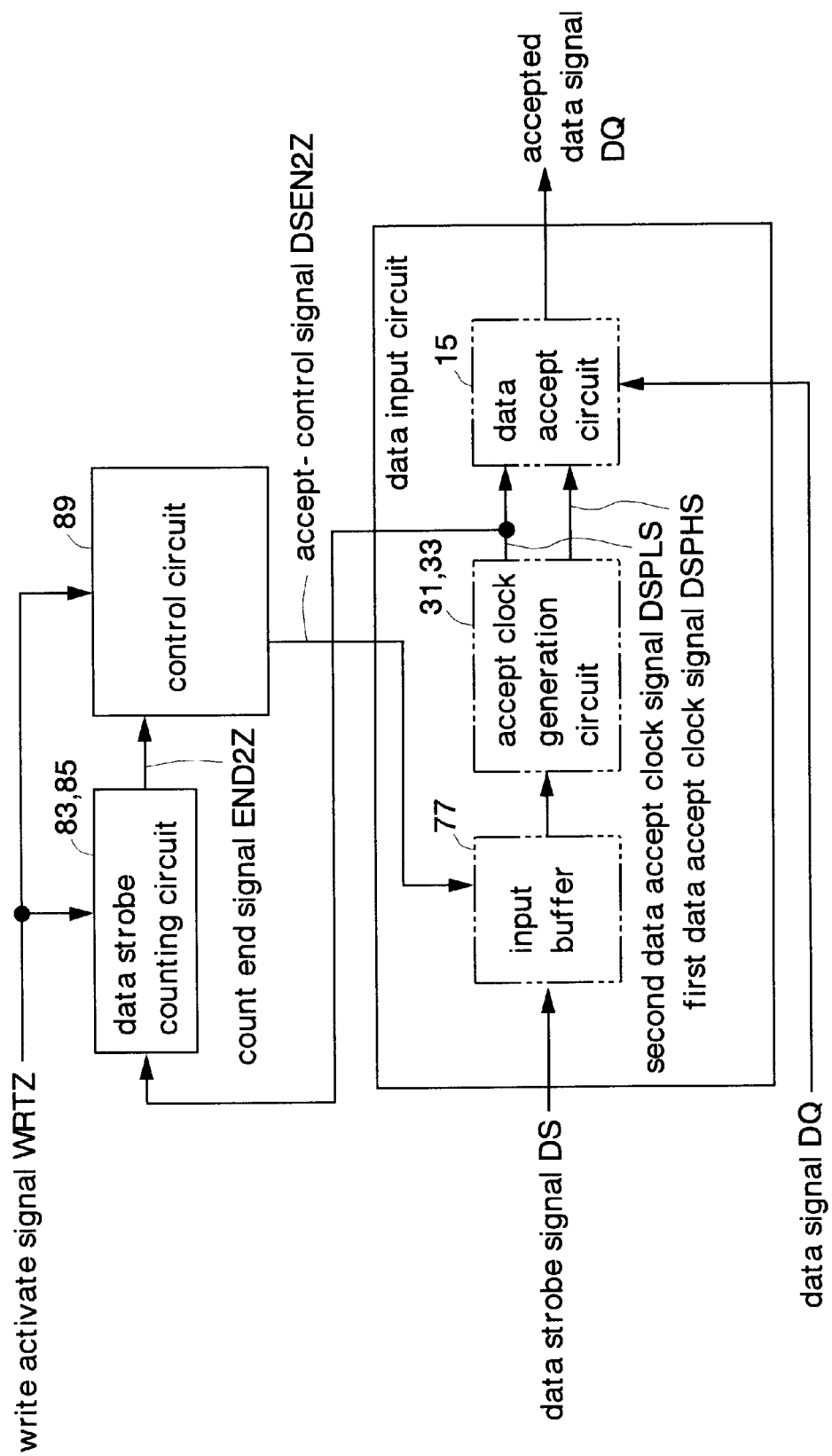
FIG. 18 is a block diagram showing the basic principle of a fourth embodiment of a semiconductor device according to the present invention.

FIG. 18 is a block diagram showing the basic principle of a fourth embodiment of the semiconductor device according to the present invention, wherein the device comprises a data strobe counting circuit and a control circuit which are identical with those in FIG. 14 (the third embodiment), and a data input circuit which is identical with that in FIG. 11 (the second embodiment).

Figure 19:
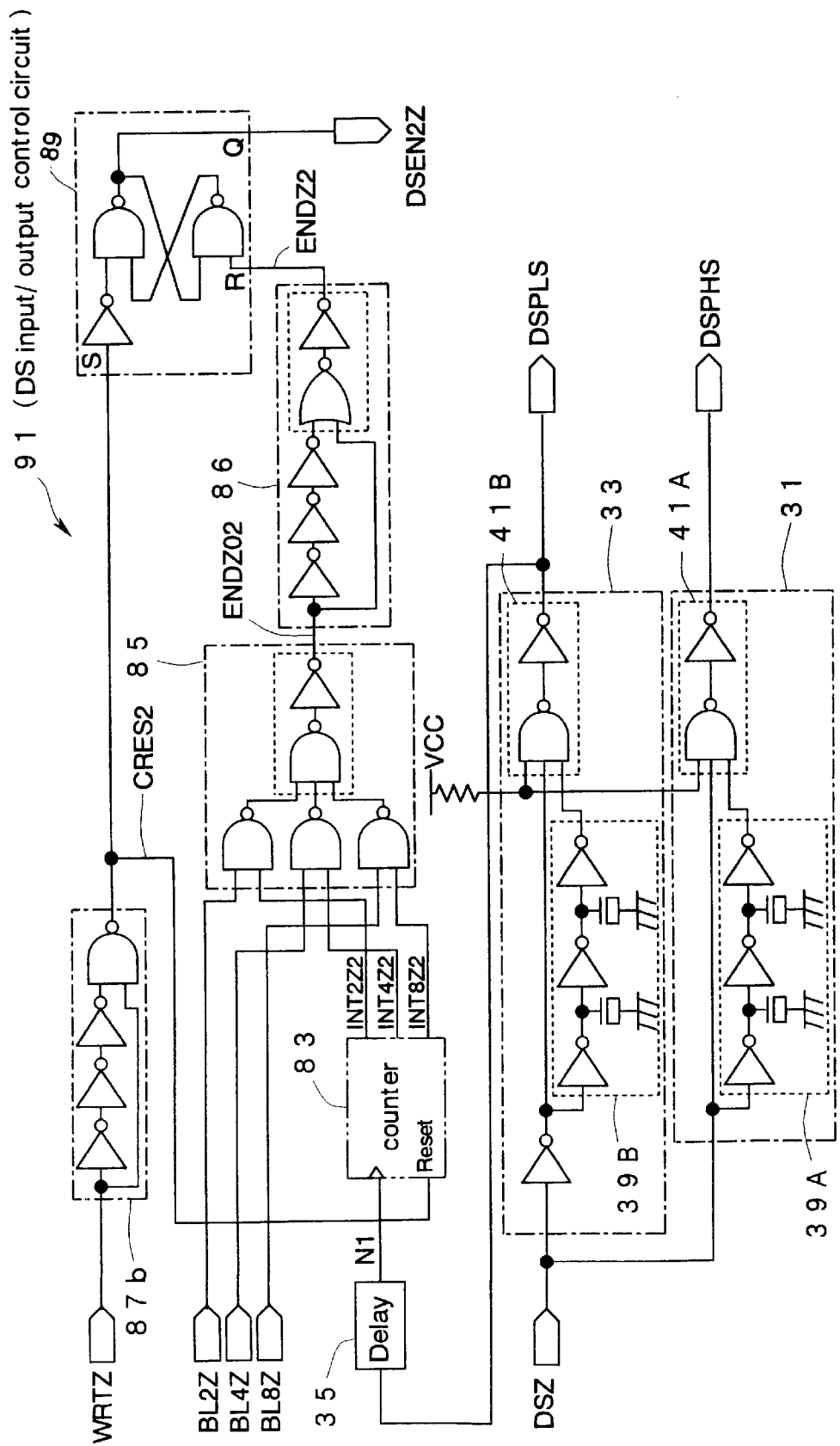
FIG. 19 is a circuit diagram showing a DS input/output control circuit in the fourth embodiment of a semiconductor device according to the present invention.

FIG. 19 shows a DS input/output control circuit 91 according to the fourth embodiment.

In this embodiment, similarly as in the second embodiment, the accept-control signal DSEN2Z is not inputted to the AND circuit 41A of the H edge pulse generation unit 31 and the AND circuit 41B of the L edge pulse generation unit 33 in FIG. 16. The input terminals of the AND circuit 41A and the AND circuit 41B in the first embodiment which receive the accept-control signal DSEN2Z is pulled-up to the supply voltage VCC.

A DS buffer 77 which is identical with that in the second embodiment shown in FIG. 13 is also used in this embodiment. Namely, the accept-control signal DSEN2Z is used for activating the differential amplifier circuit 45.

A similar effect with that in the first and the second embodiments mentioned above can also be obtained in the semiconductor device of this embodiment.

Figure 20:
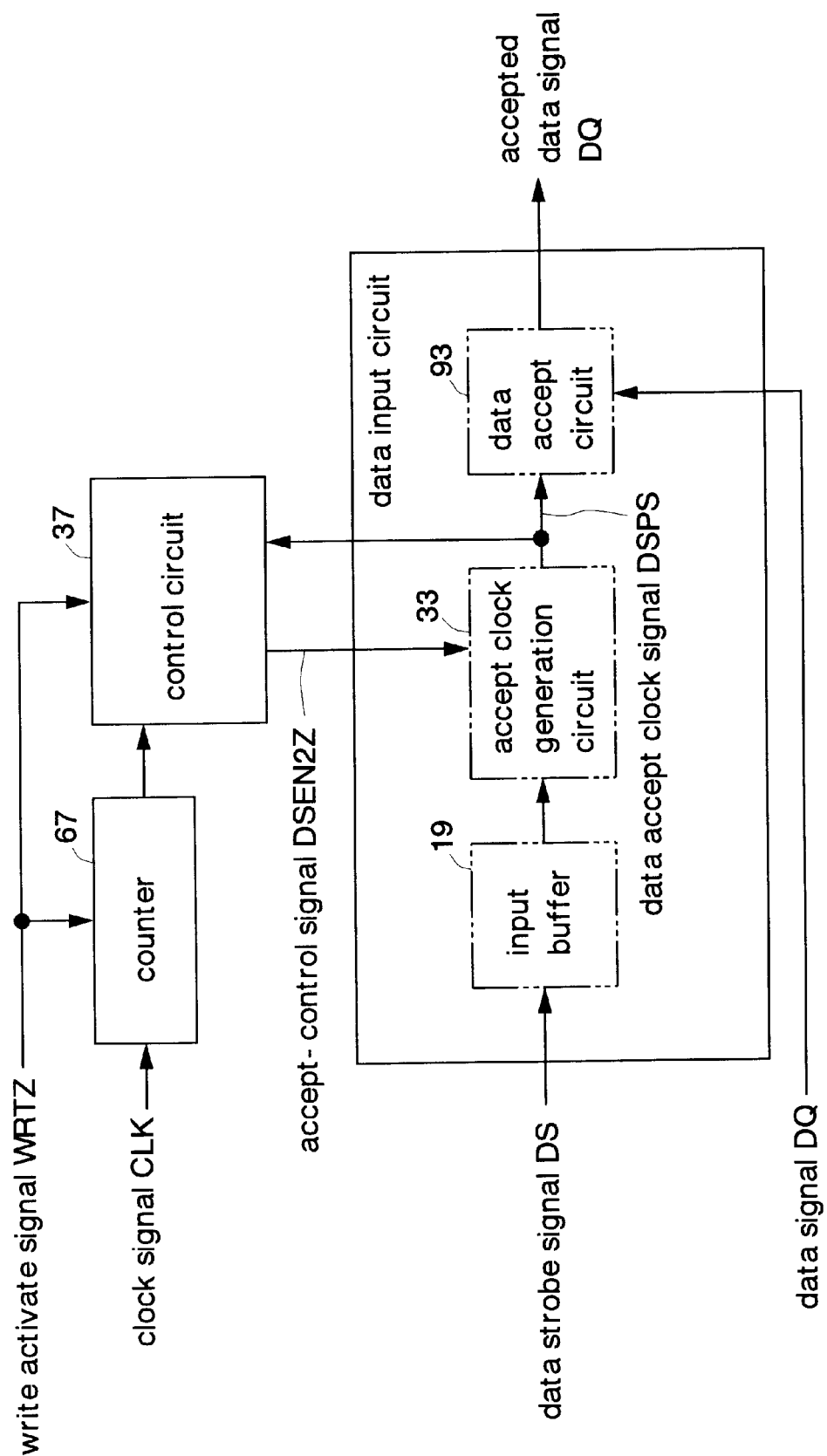
FIG. 20 is a block diagram showing the basic principle of a fifth embodiment of a semiconductor device according to the present invention.

FIG. 20 is a block diagram showing the basic principle of a fifth embodiment of the semiconductor device according to the present invention, wherein the device comprises a counter, a control circuit, and a data input circuit which are identical with those in FIG. 1 (the first embodiment). The data input circuit includes an input buffer, an accept clock generation circuit, and a data accept circuit which are identical with those in FIG. 1.

The accept clock generation circuit is a circuit corresponding to the L edge pulse generation unit 33. The accept-control signal DSEN2Z generated by the control circuit is inputted to the accept clock generation circuit. The accept clock generation circuit has a function of generating and outputting the data accept clock signal DSPS on receipt of the internal data strobe signal DSZ.

The data accept circuit has a function of accepting the data signals DQ, which is the write-data, into the semiconductor device in synchronization with the data accept clock signal DSPS.

Figure 21:
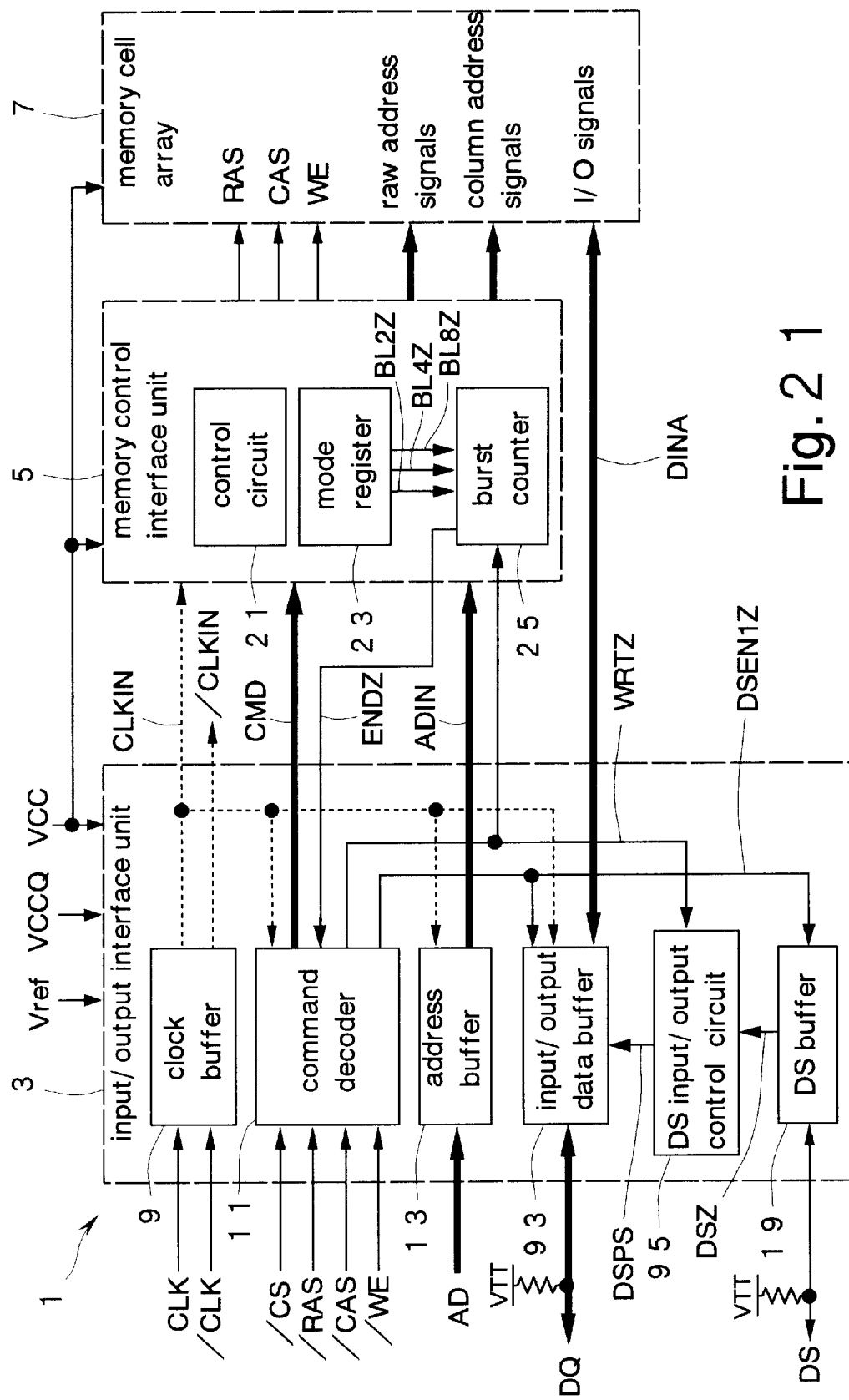
FIG. 21 is a general view showing the fifth embodiment of a semiconductor device according to the present invention.

FIG. 21 shows a fifth embodiment of the semiconductor device according to the present invention. The semiconductor device 1 according to this embodiment is composed of a SDR type SDRAM for performing write/read operation of the data signals DQ in synchronization with the trailing edge of the data strobe signal inputted from the outside.

The input/output data buffer 93 and the memory cell array 7 perform input/output operation of the I/O signals DINA only. The DS input/output control circuit 95 outputs only the second data accept clock signal DSPLS being in synchronization with the trailing edge of the data strobe signal DS to the input/output data buffer 93. The components except for the input/output data buffer 93 and the DS input/output control circuit 95 are identical with those in the above described first embodiment.

Figure 22:
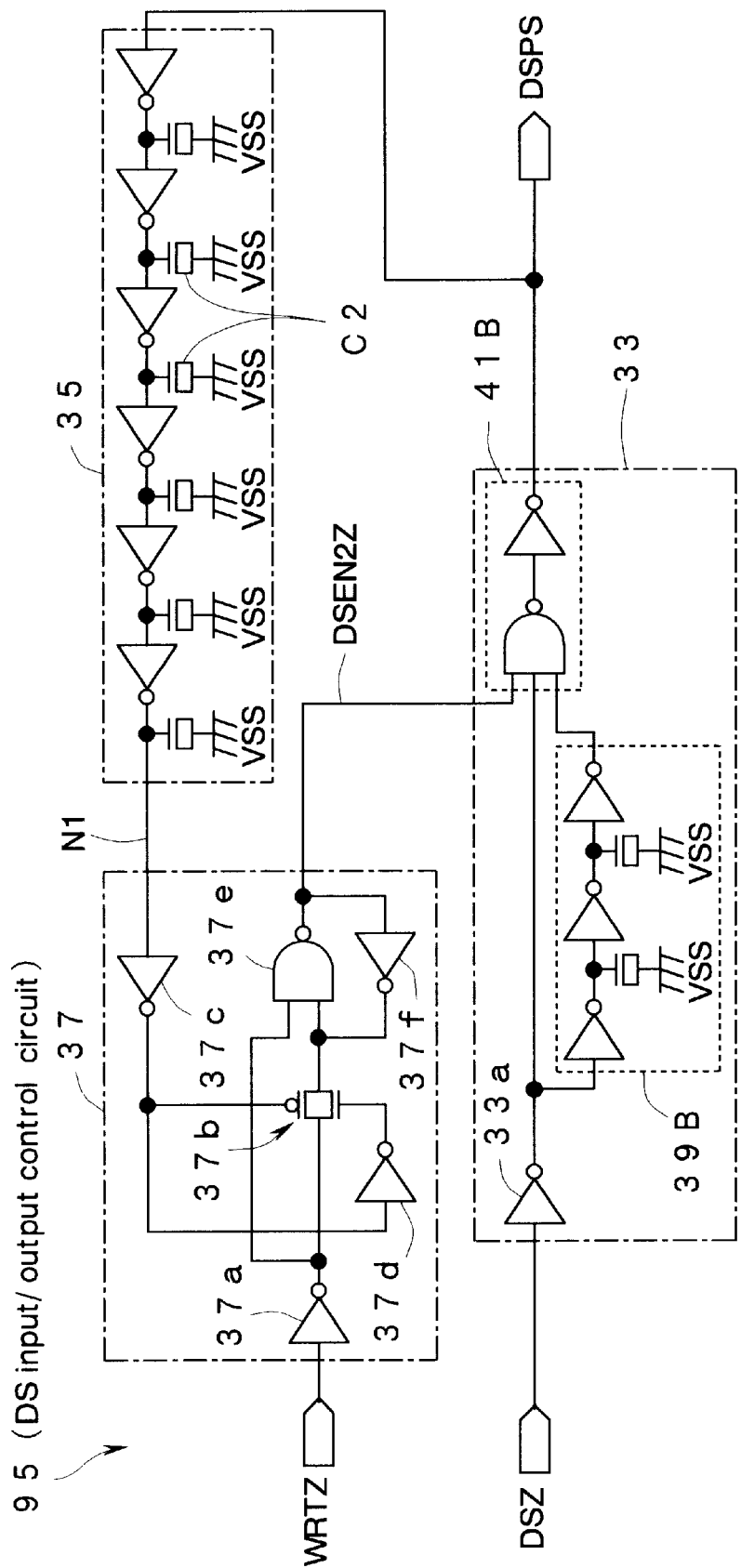
FIG. 22 is a circuit diagram showing a DS input/output control circuit depicted in FIG. 21.

FIG. 22 shows a circuit configuration of the DS input/output control circuit 95. The DS input/output control circuit 95 includes the L edge pulse generation unit 33 for generating the data accept clock signal DSPS, the delay circuit 35, and the latch unit 37. Namely, the DS input/output control circuit 95 is composed of a circuit excluding the H edge pulse generation unit 31 from the DS input/output control circuit 17 of the first embodiment. The connections of the L edge pulse generation unit 33, the delay circuit 35, and the latch unit 37 are identical with those in the first embodiment.

Figure 23:
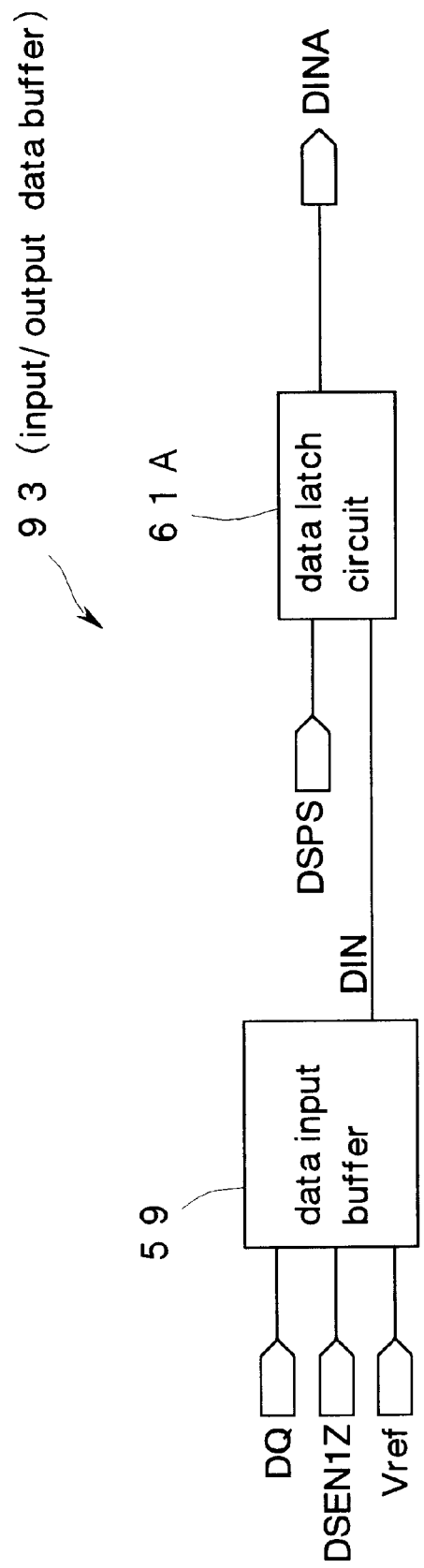
FIG. 23 is a block diagram showing an input/output data buffer depicted in FIG. 21.

FIG. 23 shows a block diagram of the input/output data buffer 93. The input/output data buffer 93 includes the data input buffer 59 and the data latch circuit 61A. Namely, the input/output data buffer 93 is composed of a circuit excluding the data latch circuit 61B, and the data transfer circuits 63A and 63B from the input/output data buffer 15 of the first embodiment. The connections of the data input buffer 59 and the data latch circuit 61A are identical with those in the first embodiment.

Figure 24:
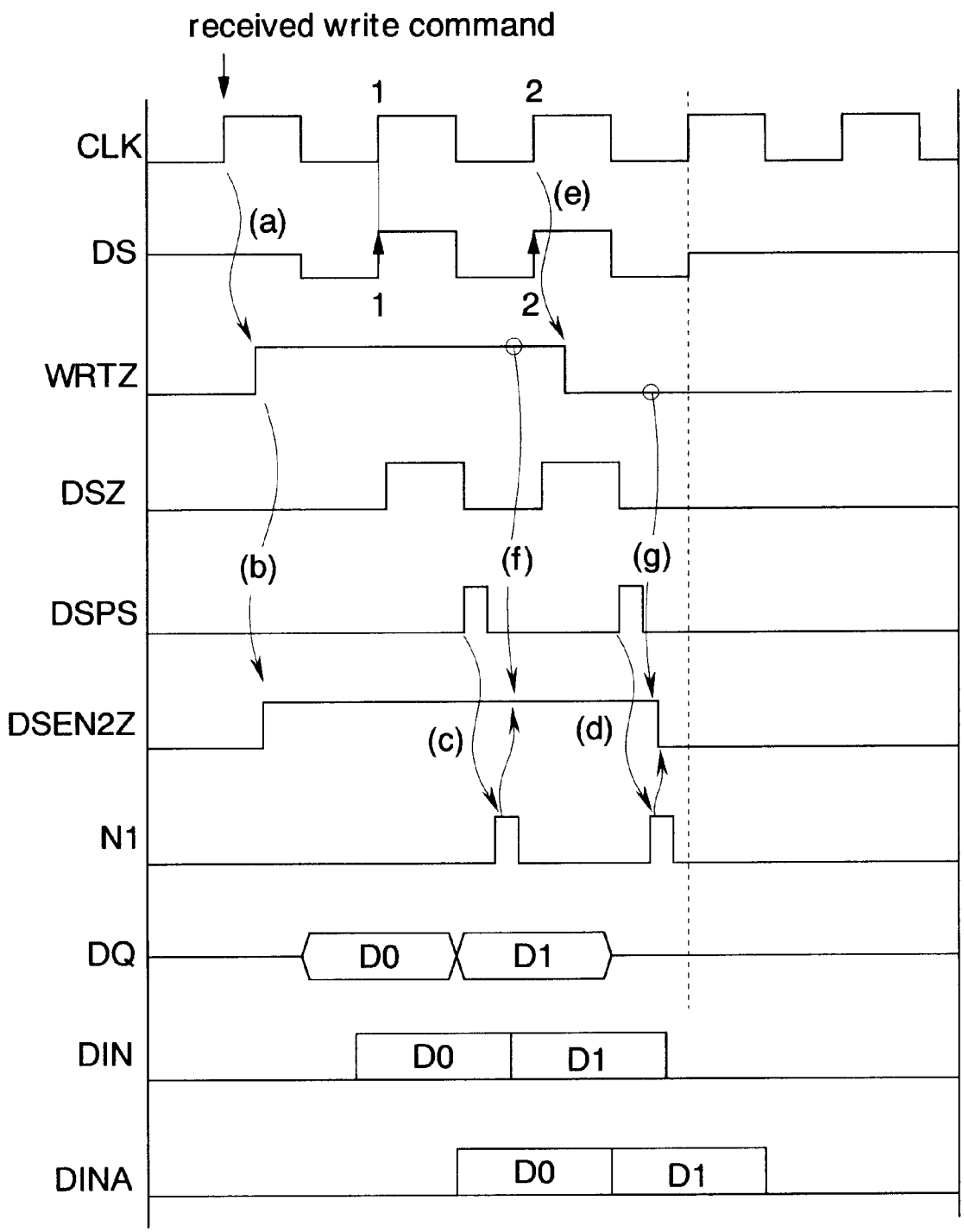
FIG. 24 is a timing chart showing an operation of when data is written according to the device in FIG. 21.
Figure 2:
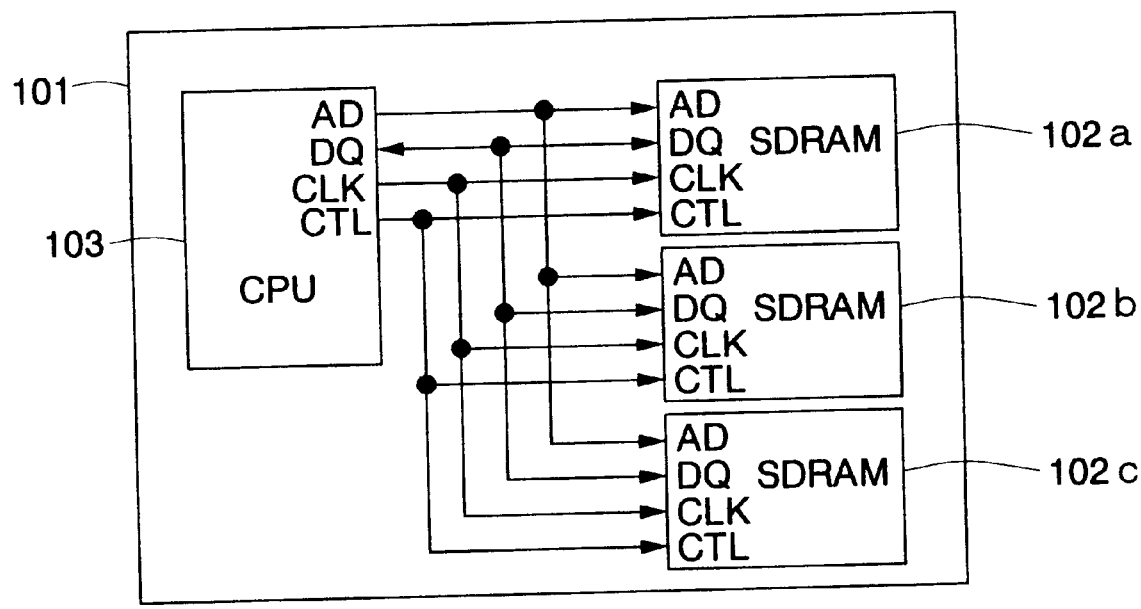
Figure 2:
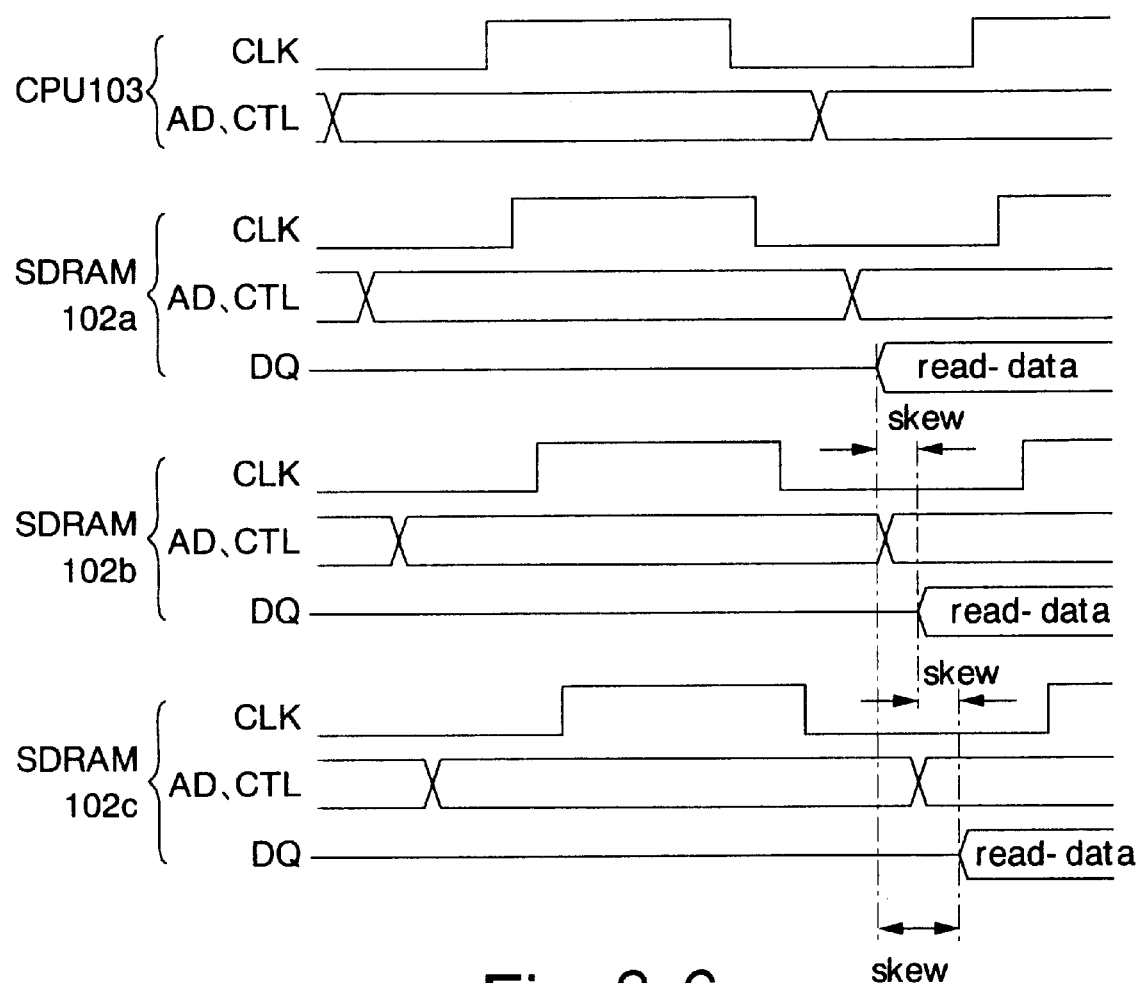
Figure 27:
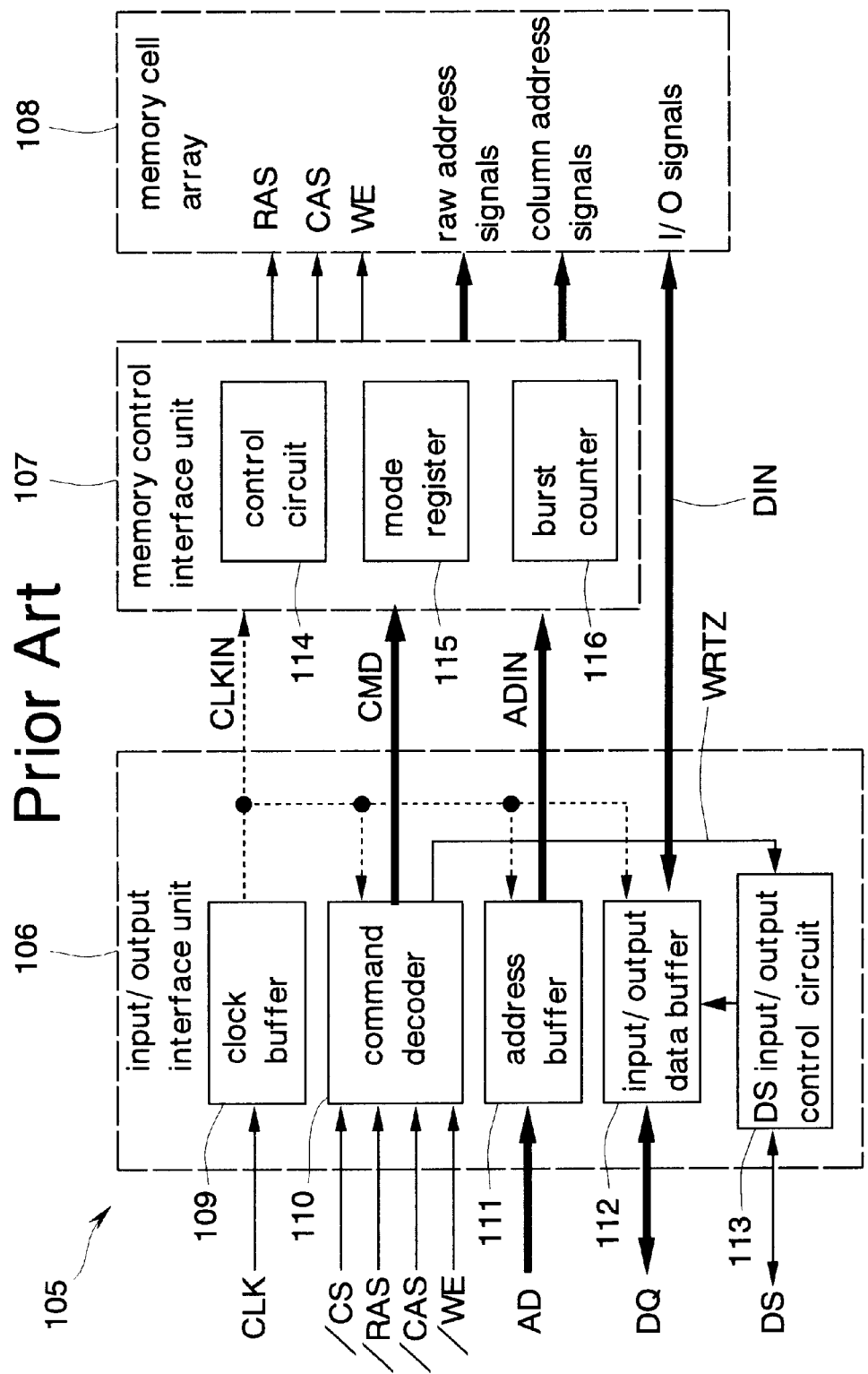
FIG. 27 is a schematic diagram showing a conventional SDRAM having a DS signal.
Figure 28:
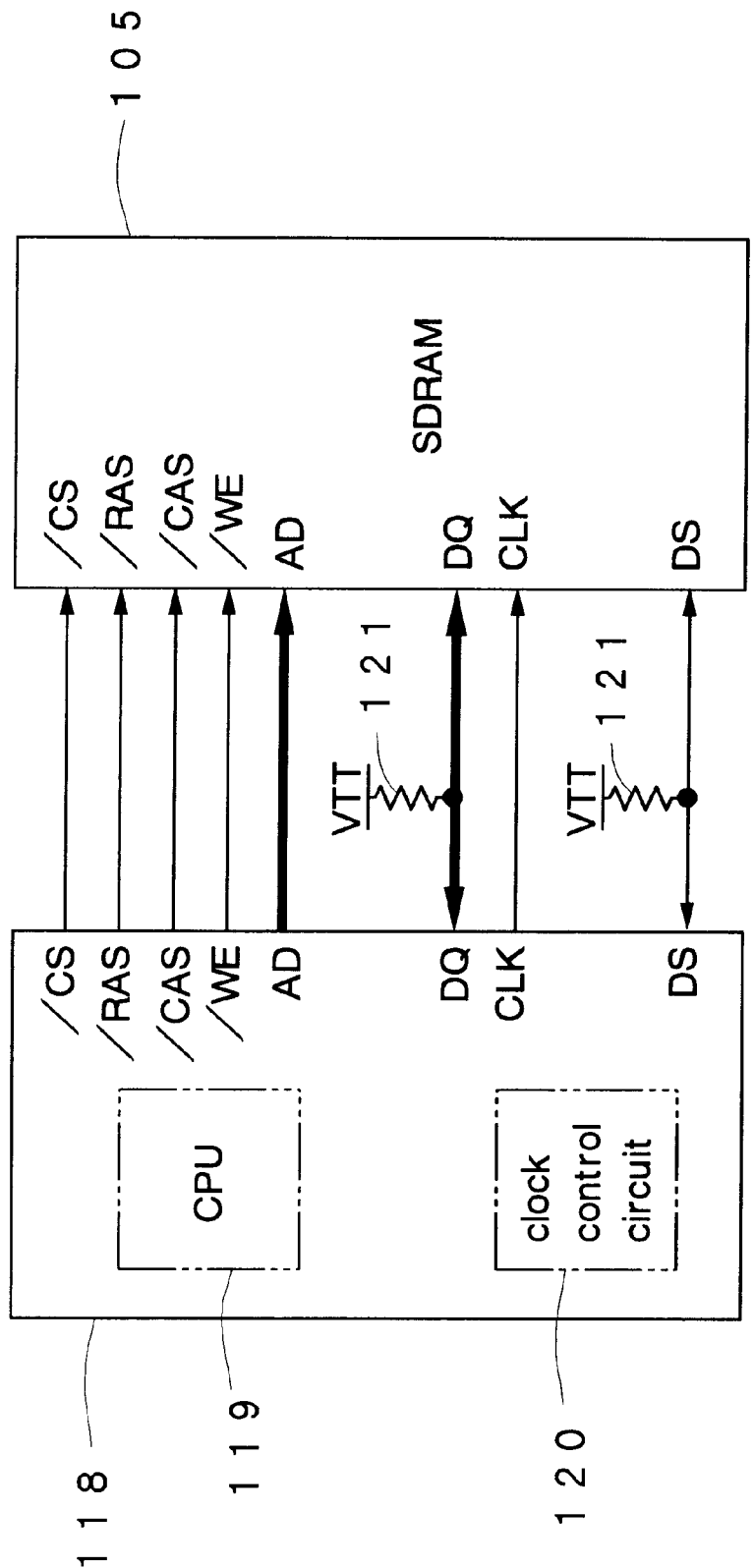
FIG. 28 is a schematic diagram showing an information processing system including a conventional SDRAM having a DS signal.
Figure 29:
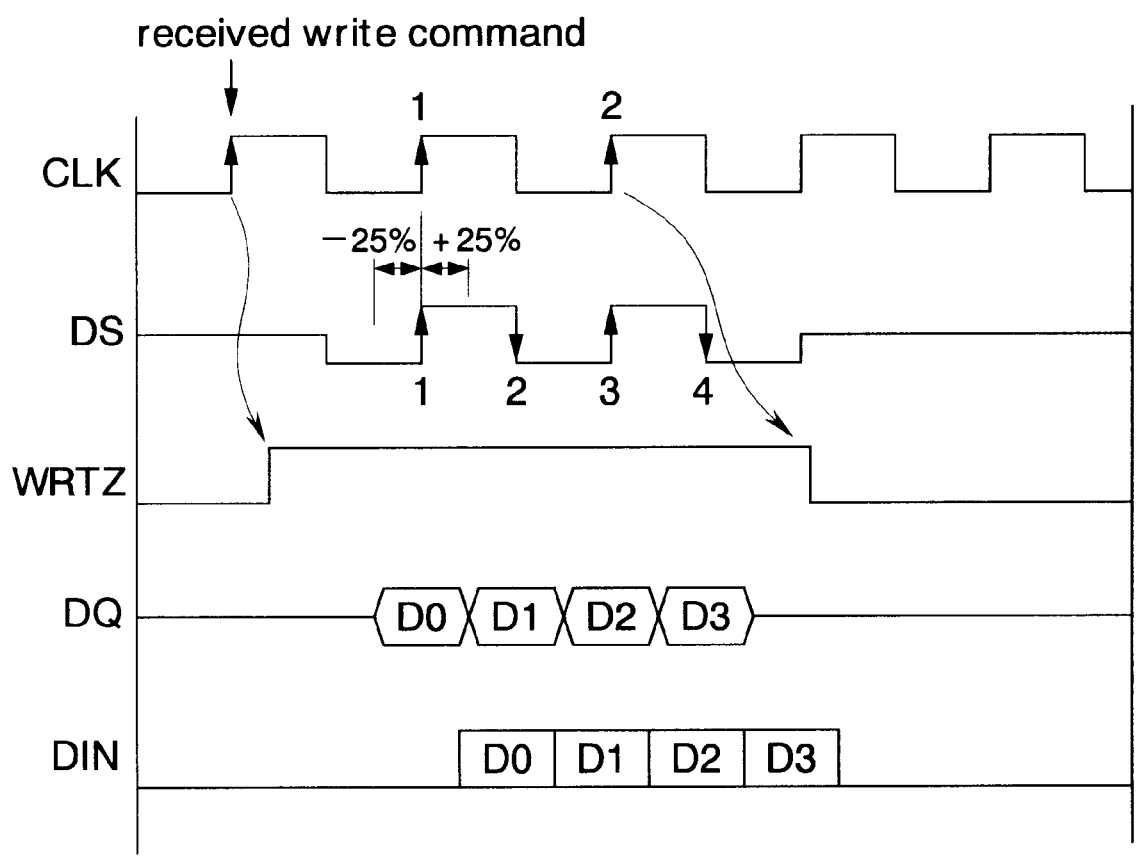
FIG. 29 is a timing chart showing a write operation in a conventional SDRAM having a DS signal.

In the above-mentioned semiconductor device, operation of accepting the data signals DQ successively inputted from the outside is performed as shown in FIG. 24.

First, the semiconductor device 1 turns the write activate signal WRTZ to HIGH level on receipt of the write command, which in turn sets the accept-control signal DSEN2Z to HIGH level.

The change of the accept-control signal DSEN2Z to HIGH level activates the L edge pulse generation unit 33. Then, the data accept clock signal DSPS is generated in synchronization with the trailing edge of the data strobe signal DS, and the write-data D0 and D1 are sequentially accepted in the data latch circuit 61A. The accepted write-data D0 and D1 are transferred to the I/O signals DINA.

The counter 67 shown in FIG. 7 is counted up by the internal clock signal CLKIN each time the clock signal CLK rises.

When the count value of the counter 67 becomes "2", the write activate signal WRTZ falls to LOW level. Thus, the number of counts by the counter 67 in this embodiment is made to be identical with the "burst length". In other words, the "burst length" equals to the number of counts.

On the other hand, the accept-control signal DSEN2Z falls to LOW level at the timing of the second pulse output of the delay signal N1, detecting the LOW level of the write activate signal WRTZ.

Thus the L edge pulse generation unit 33 is inactivated by the accept-control signal DSEN2Z, and the accept operation of the data signals DQ is completed.

A similar effect with that in the first embodiment mentioned above can also be obtained in the semiconductor device of this embodiment. In this embodiment, however, the data accept clock signal DSPS being in synchronization with the data strobe signal DS is generated by the L edge pulse generation unit 33 when the accept-control signal DSEN2Z is activated, the data accept clock signal DSPS is received by the input/output data buffer 93, and the data signals DQ is accepted in synchronization with the data accept clock signal DSPS. Therefore, controlling the generation of the data accept clock signal DSPS which accepts the data signals DQ can be directly controlled by the accept-control signal DSEN2Z, and generation or non-generation of the data accept clock signal DSPS can be controlled by a simple circuit.

Moreover, the data strobe signal DS being in synchronization with the final data signal DQ can be easily and reliably detected by applying the present embodiment to an SDR type semiconductor device for accepting the data signals DQ in synchronization with either the leading edge or the trailing edge of the data strobe signal DS.

Here, in the first embodiment mentioned above, description is given with regard to an exemplary semiconductor device composed of SDRAM. However, the present invention is not limited to such embodiments. The semiconductor device may be composed of, for example, a system LSI including DRAM that performs input/output operation of the data signals DQ in synchronization with data strobe signal DS.

Additionally, in the fifth embodiment mentioned above, description is given with regard to an example wherein the counter 67 is counted up at the leading edge of the clock signal CLK, and the accept-control signal DSEN2Z is set to LOW level after a predetermined number is counted. However, the present invention is not limited to such embodiments. For example, the counting may take place at the leading edge of the second data accept clock signal DSPLS generated from the data strobe signal DS, using the DS input/output control circuit 81. In this case, the post-counting control can be performed in a shorter time than in the case with counting the data strobe signal DS by inputting directly to the counter 83 the second data accept clock signal DSPLS which accepts the data signals DQ.

Furthermore, since the second data accept clock signal DSPLS is a signal generated from the data strobe signal DS, counting by the counter 83, and inactivating-control of the accept-control signal DSEN2Z after counting of the predetermined number can be performed in synchronization with the data strobe signal DS.

Moreover, in the first and the fifth embodiments mentioned above, description is given with regard to examples wherein the "burst length" is set to be twice as much as, or equal to the number of counts of the clock signal CLK. However, the present invention is not limited to such embodiments. For example, the "burst length" may be set to four or eight times as much as the number of counts of the clock signal CLK.

What is claimed is:

1. A semiconductor device for accepting data which includes serial data signals in synchronization with a data strobe signal exclusively for writing and/or reading data, said semiconductor device comprising:

a data input circuit accepting said data which is transferred to an internal circuit, the data input circuit having an inactive state in response to a timing of said data strobe signal corresponding to a final bit of said serial data signals.

2. A semiconductor device for receiving a clock signal and a data strobe signal exclusively for writing and/or reading data, and accepting a number of data signals in synchronization with said data strobe signal, said semiconductor device comprising:

a control circuit generating an accept-control signal which is activated in response to a write command inputted in synchronization with said clock signal, and is inactivated in response to said data strobe signal corresponding to a final data signal of said data signals; and a data input circuit for accepting said data signals while said accept-control signal is activated.

3. The semiconductor device according to claim 2, wherein said semiconductor device further comprises:

a counter counting the number of said clock signal after receiving said write command, wherein said control circuit inactivates said accept-control signal in response to a transition of said data strobe signal after a completion of the counting at the counter.

4. The semiconductor device according to claim 3, wherein said data input circuit comprises:

an accept clock generation circuit for generating a data accept clock signal in synchronization with said data strobe signal while said accept-control signal is activated, and a data accept circuit for accepting said data signals in synchronization with said data accept clock signal.

5. The semiconductor device according to claim 4, wherein said control circuit inactivates said accept-control signal in response to a transition of said data accept clock signal after the completion of the counting at the counter.

6. The semiconductor device according to claim 3, wherein said data input circuit comprises:

an accept clock generation circuit for generating a first data accept clock signal and a second data accept clock signal, in synchronization with the leading edge and the trailing edge, of said data strobe signal, while said accept-control signal is activated; and a data accept circuit for accepting said data signals in synchronization with said first and second data accept clock signals respectively.

7. The semiconductor device according to claim 6, wherein said control circuit inactivates said accept-control signal in response to a transition of said first or second data accept clock signal after the completion of the counting at the counter.

8. The semiconductor device according to claim 3, wherein said semiconductor device further comprises:

an input buffer for accepting said data strobe signal while said accept-control signal is activated.

9. The semiconductor device according to claim 3, wherein the number of accepting said data is an integral multiple of the number of said clock signal counted by said counter.

10. The semiconductor device according to claim 2, wherein said semiconductor device further comprises:

data strobe counting circuit for counting the number of said data strobe signal after receiving said write command, wherein said control circuit inactivates said accept-control signal in response to completion of counting at said data strobe counting circuit.

11. The semiconductor device according to claim 10, wherein said data input circuit comprises:

an accept clock generation circuit for generating a data accept clock signal being in synchronization with said data strobe signal while said accept-control signal is activated; and a data accept circuit for accepting said data signals in synchronization with said data accept clock signal.

12. The semiconductor device according to claim 11, wherein said control circuit inactivates said accept-control signal in response to a transition of said data accept clock signal after the completion of counting at said data strobe signal is counted by said data strobe counting circuit.

13. The semiconductor device according to claim 11, wherein said data strobe counting circuit counts the number of said data accept clock signal.

14. The semiconductor device according to claim 10, wherein said data input circuit comprises:

an accept clock generation circuit for generating a first data accept clock signal and a second data accept clock signal, in synchronization with the leading edge and the trailing edge, of said data strobe signal, while said accept-control signal is activated; and a data accept circuit for accepting said data signals in synchronization with said first and second data accept clock signals respectively.

15. The semiconductor device according to claim 14, wherein said control circuit inactivates said accept-control signal in response to a transition of said first or second data accept clock signal after the completion of counting at said data strobe counting circuit.

16. The semiconductor device according to claim 14, wherein said data strobe counting circuit counts one of said first data accept clock signal or said second data accept clock signal.

17. The semiconductor device according to claim 10, wherein said semiconductor device comprises:

an input buffer for accepting said data strobe signal while said accept-control signal is activated.

18. The semiconductor device according to claim 10, wherein the number of accepting said data signals is an integral multiple of the number of said data strobe signal counted by said data strobe counting circuit.

* * * * *